(12) United States Patent
Wang

(10) Patent No.: US 11,476,854 B2
(45) Date of Patent: Oct. 18, 2022

(54) MULTIPLIER-ACCUMULATOR CIRCUITRY, AND PROCESSING PIPELINE INCLUDING SAME

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 17/219,952

(22) Filed: Apr. 1, 2021

(65) Prior Publication Data

US 2021/0273641 A1    Sep. 2, 2021

Related U.S. Application Data

(62) Division of application No. 16/887,265, filed on May 29, 2020, now Pat. No. 10,972,103, which is a
(Continued)

(51) Int. Cl.
*H03K 19/1776* (2020.01)
*H03K 19/17724* (2020.01)

(52) U.S. Cl.
CPC ... *H03K 19/1776* (2013.01); *H03K 19/17724* (2013.01)

(58) Field of Classification Search
None
See application file for complete search history.

(56) References Cited

U.S. PATENT DOCUMENTS

| 4,958,312 A | 9/1990 | Ang et al. |
| 6,115,729 A | 9/2000 | Matheny et al. |

(Continued)

FOREIGN PATENT DOCUMENTS

| EP | 0405726 | 3/1999 |
| EP | 1 229 438 A2 | 8/2002 |

(Continued)

OTHER PUBLICATIONS

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.
(Continued)

*Primary Examiner* — Anh Q Tran
(74) *Attorney, Agent, or Firm* — Neil A. Steinberg

(57) ABSTRACT

An integrated circuit comprising a plurality of multiplier-accumulator circuits, connected in series, wherein the plurality of multiplier-accumulator circuits includes a first MAC circuit, including a multiplier to multiply first data and first multiplier weight data and output first product data, and an accumulator, coupled to the multiplier of the first MAC circuit, to add second data and the first product data and output first sum data. The plurality of multiplier-accumulator circuits further includes a second MAC circuit including a multiplier to multiply third data and second multiplier weight data and output second product data, and an accumulator, coupled to the multiplier of the second MAC circuit and the accumulator of the first MAC circuit, to generate and output second sum data. A first load-store register is coupled to an output of the accumulator of the first MAC circuit and an input of the accumulator of the second MAC circuit.

21 Claims, 27 Drawing Sheets

Related U.S. Application Data division of application No. 16/545,345, filed on Aug. 20, 2019, now Pat. No. 10,693,469.

(60) Provisional application No. 62/725,306, filed on Aug. 31, 2018.

(56) References Cited

U.S. PATENT DOCUMENTS

| | | | |
|---|---|---|---|
| 6,148,101 A | 11/2000 | Tanaka et al. | |
| 6,298,366 B1 | 10/2001 | Gatherer et al. | |
| 7,107,305 B2 | 9/2006 | Deng et al. | |
| 7,299,342 B2 | 11/2007 | Nilsson et al. | |
| 7,346,644 B1 * | 3/2008 | Langhammer | H03K 19/17732 326/38 |
| 7,698,358 B1 | 4/2010 | Langhammer et al. | |
| 8,051,124 B2 | 11/2011 | Salama et al. | |
| 8,645,450 B1 | 2/2014 | Choe et al. | |
| 8,751,551 B2 * | 6/2014 | Streicher | H03K 19/17732 708/203 |
| 8,788,562 B2 | 7/2014 | Langhammer et al. | |
| 9,600,278 B1 | 3/2017 | Langhammer | |
| 10,693,469 B2 | 6/2020 | Wang | |
| 10,972,103 B2 | 4/2021 | Wang | |
| 2003/0172101 A1 | 9/2003 | Liao et al. | |
| 2007/0239967 A1 | 10/2007 | Dally et al. | |
| 2009/0094303 A1 | 4/2009 | Katayama | |
| 2014/0019727 A1 | 1/2014 | Zhu et al. | |
| 2017/0115958 A1 | 4/2017 | Langhammer | |
| 2017/0116693 A1 | 4/2017 | Rae et al. | |
| 2017/0214929 A1 | 7/2017 | Susnow et al. | |
| 2017/0322813 A1 | 11/2017 | Langhammer | |
| 2017/0344876 A1 | 11/2017 | Brothers | |
| 2018/0052661 A1 | 2/2018 | Langhammer | |
| 2018/0081632 A1 | 3/2018 | Langhammer | |
| 2018/0081633 A1 | 3/2018 | Langhammer | |
| 2018/0157961 A1 | 6/2018 | Henry et al. | |
| 2018/0189651 A1 | 7/2018 | Henry et al. | |
| 2018/0300105 A1 | 10/2018 | Langhammer | |
| 2018/0321909 A1 | 11/2018 | Langhammer | |
| 2018/0321910 A1 | 11/2018 | Langhammer et al. | |
| 2018/0341460 A1 | 11/2018 | Langhammer | |
| 2018/0341461 A1 | 11/2018 | Hammer | |
| 2019/0042191 A1 | 2/2019 | Langhammer | |
| 2019/0079728 A1 | 3/2019 | Langhammer et al. | |
| 2019/0196786 A1 | 6/2019 | Langhammer | |
| 2019/0250886 A1 | 8/2019 | Langhammer | |
| 2019/0286417 A1 | 9/2019 | Langhammer | |
| 2019/0310828 A1 | 10/2019 | Langhammer et al. | |
| 2019/0324722 A1 | 10/2019 | Langhammer | |
| 2020/0004506 A1 | 1/2020 | Langhammer et al. | |
| 2020/0026493 A1 | 1/2020 | Streicher et al. | |
| 2020/0174750 A1 | 6/2020 | Langhammer | |
| 2020/0326948 A1 | 10/2020 | Langhammer | |

FOREIGN PATENT DOCUMENTS

| | | | |
|---|---|---|---|
| EP | 1 229 438 A3 | 3/2005 | |
| EP | 2280341 | 6/2013 | |

OTHER PUBLICATIONS

Linley Gwennap, "IBM Demonstrates New AI Data Types", Microprocessor Report, Apr. 2021.

Choi et al., "Accurate and Efficient 2-Bit Quantized Neural Networks", Proceedings of $2^{nd}$ SysML Conf, 2019, 12 pages.

Sun et al., "Hybrid 8-bit Floating Point (HFP8) Training and Inference for Deep Neural Networks", NeurIPS 2019, 10 pages.

"nVidia A100 Tensor Core GPU Architecture", v1.0, 2020, 82 pages.

Papadantonakis et al., "Pipelining Saturated Accumulation", IEEE, vol. 58, No. 2, pp. 208-219, Feb. 2009.

Priyanka Nain, "Multiplier-Accumulator (MAC) Unit", IJDACR, vol. 5, Issue 3, Oct. 2016, 4 pages.

Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.

EPO Supplementary Search Report, dated Nov. 9, 2021, 9 pages.

* cited by examiner

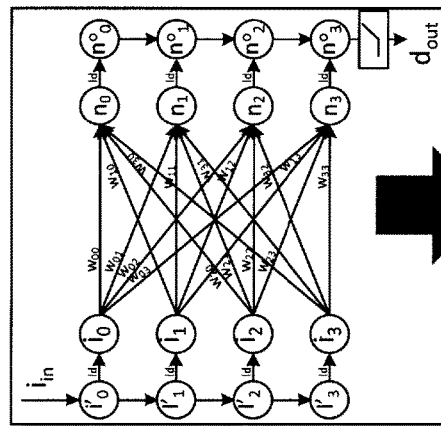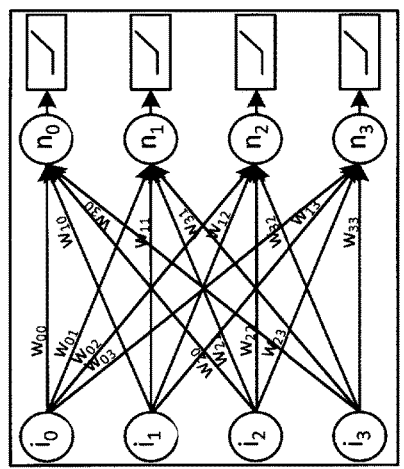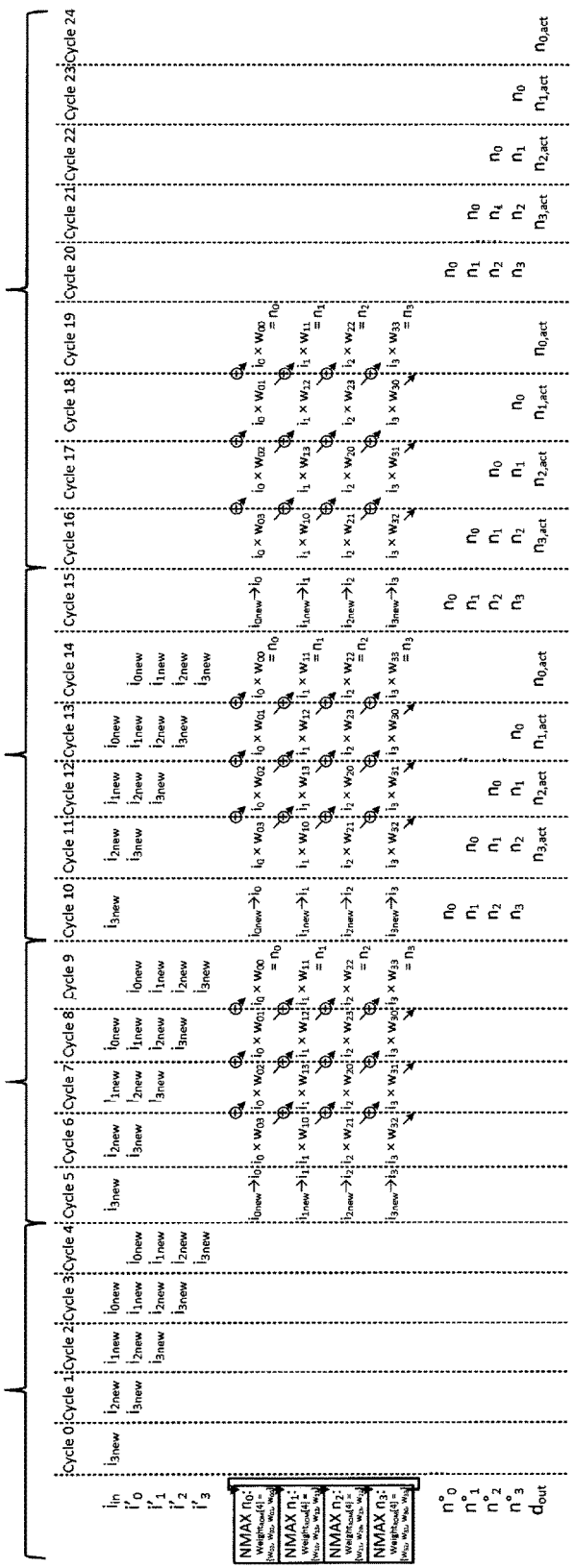

| | Cycle 0 | Cycle 1 | Cycle 2 | Cycle 3 | Cycle 4 |
|---|---|---|---|---|---|
| $i_{in}$ | $i_{3new}$ | $i_{2new}$ | $i_{1new}$ | $i_{0new}$ | |
| $i'_0$ | | $i_{3new}$ | $i_{2new}$ | $i_{1new}$ | $i_{0new}$ |
| $i'_1$ | | | $i_{3new}$ | $i_{2new}$ | $i_{1new}$ |
| $i'_2$ | | | | $i_{3new}$ | $i_{2new}$ |
| $i'_3$ | | | | | $i_{3new}$ |

NMAX $n_0$: Weight$_{ROM}$[4] = $\{w_{03}, w_{02}, w_{01}, w_{00}\}$

NMAX $n_1$: Weight$_{ROM}$[4] = $\{w_{10}, w_{13}, w_{12}, w_{11}\}$

NMAX $n_2$: Weight$_{ROM}$[4] = $\{w_{21}, w_{20}, w_{23}, w_{22}\}$

NMAX $n_3$: Weight$_{ROM}$[4] = $\{w_{32}, w_{31}, w_{30}, w_{33}\}$ $n°_0$
$n°_1$
$n°_2$
$n°_3$
$d_{out}$

FIG. 2B

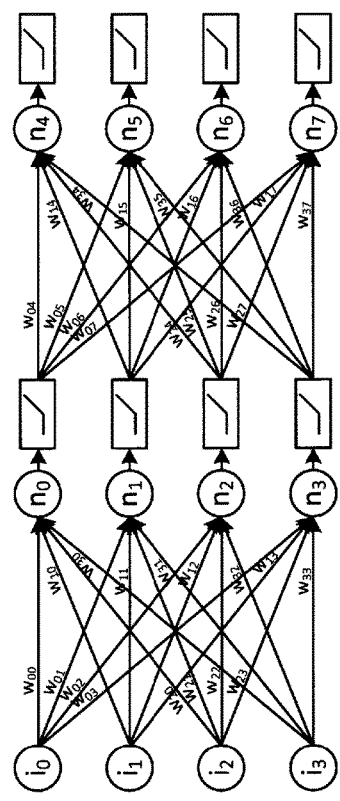
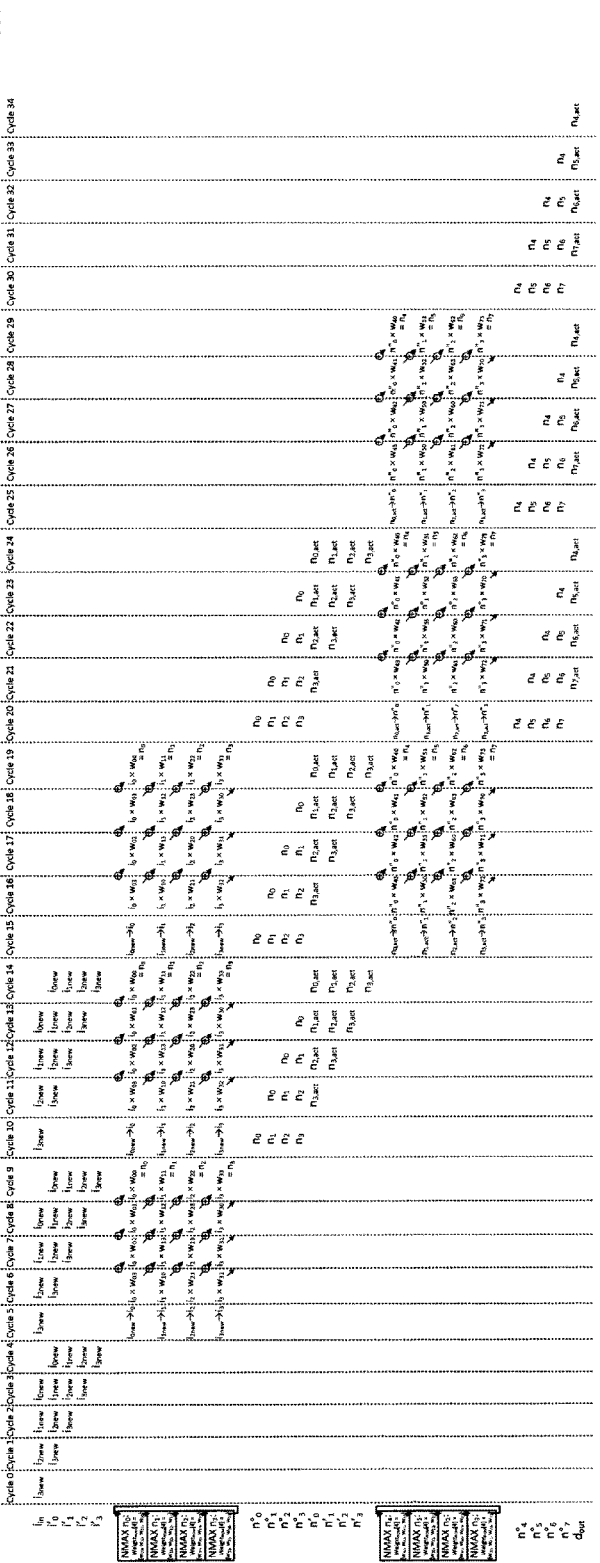
FIG. 11A
FIG. 11B FIG. 11C FIG. 11D FIG. 11E

| | Cycle 0 | Cycle 1 | Cycle 2 | Cycle 3 | Cycle 4 |
|---|---|---|---|---|---|
| $i_{in}$ | $i_{3new}$ | $i_{2new}$ | $i_{1new}$ | $i_{0new}$ | |
| $i'_0$ | | $i_{3new}$ | $i_{2new}$ | $i_{1new}$ | $i_{0new}$ |
| $i'_1$ | | | $i_{3new}$ | $i_{2new}$ | $i_{1new}$ |
| $i'_2$ | | | | $i_{3new}$ | $i_{2new}$ |
| $i'_3$ | | | | | $i_{3new}$ |

NMAX $n_0$: Weight$_{ROM}$[4] = {$w_{03}, w_{02}, w_{01}, w_{00}$}

NMAX $n_1$: Weight$_{ROM}$[4] = {$w_{10}, w_{13}, w_{12}, w_{11}$}

NMAX $n_2$: Weight$_{ROM}$[4] = {$w_{21}, w_{20}, w_{23}, w_{22}$}

NMAX $n_3$: Weight$_{ROM}$[4] = {$w_{32}, w_{31}, w_{30}, w_{33}$}

$n°_0$
$n°_1$
$n°_2$
$n°_3$
$n'_0$
$n'_1$
$n'_2$
$n'_3$

NMAX $n_4$: Weight$_{ROM}$[4] = {$w_{43}, w_{42}, w_{41}, w_{40}$}

NMAX $n_5$: Weight$_{ROM}$[4] = {$w_{50}, w_{53}, w_{52}, w_{51}$}

NMAX $n_6$: Weight$_{ROM}$[4] = {$w_{61}, w_{60}, w_{63}, w_{62}$}

NMAX $n_7$: Weight$_{ROM}$[4] = {$w_{72}, w_{71}, w_{70}, w_{73}$}

$n°_4$
$n°_5$
$n°_6$
$n°_7$
$d_{out}$

| Cycle 25 | Cycle 26 | Cycle 27 | Cycle 28 | Cycle 29 | Cycle 30 | Cycle 31 | Cycle 32 | Cycle 33 | Cycle 34 |
|---|---|---|---|---|---|---|---|---|---|
| $n_{0,act} \rightarrow n''_0$ | $n''_0 \times w_{43}$ | $n''_0 \times w_{42}$ | $n''_0 \times w_{41}$ | $n''_0 \times w_{40} = n_4$ | | | | | |
| $n_{1,act} \rightarrow n''_1$ | $n''_1 \times w_{50}$ | $n''_1 \times w_{53}$ | $n''_1 \times w_{52}$ | $n''_1 \times w_{51} = n_5$ | | | | | |
| $n_{2,act} \rightarrow n''_2$ | $n''_2 \times w_{61}$ | $n''_2 \times w_{60}$ | $n''_2 \times w_{63}$ | $n''_2 \times w_{62} = n_6$ | | | | | |
| $n_{3,act} \rightarrow n''_3$ | $n''_3 \times w_{72}$ | $n''_3 \times w_{71}$ | $n''_3 \times w_{70}$ | $n''_3 \times w_{73} = n_7$ | | | | | |
| $n_4$ | | | | | $n_4$ | | | | |
| $n_5$ | $n_4$ | | | | $n_5$ | $n_4$ | | | |
| $n_6$ | $n_5$ | $n_4$ | | | $n_6$ | $n_5$ | $n_4$ | | |
| $n_7$ | $n_6$ | $n_5$ | $n_4$ | | $n_7$ | $n_6$ | $n_5$ | $n_4$ | |
| | $n_{7,act}$ | $n_{6,act}$ | $n_{5,act}$ | $n_{4,act}$ | | $n_{7,act}$ | $n_{6,act}$ | $n_{5,act}$ | $n_{4,act}$ |

FIG. 11E

MULTIPLIER-ACCUMULATOR CIRCUITRY, AND PROCESSING PIPELINE INCLUDING SAME

RELATED APPLICATION

This application is a divisional of U.S. Non-Provisional application Ser. No. 16/887,265, filed May 29, 2020 (still pending), which is a divisional of U.S. Non-Provisional application Ser. No. 16/545,345, filed Aug. 20, 2019 (now U.S. Pat. No. 10,693,469). This application, the '265 application and the '345 application claims priority to and the benefit of U.S. Provisional App. No. 62/725,306, filed Aug. 31, 2018. The '306 provisional application is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof.

In one aspect, the present inventions are directed to multiplier-accumulator circuitry and techniques for operating such circuitry. In one embodiment, the multiplier-accumulator circuitry of the present inventions include a plurality of separate multiplier-accumulator circuits and a plurality of registers (including a plurality of shadow registers) that facilitate pipelining of the multiply and accumulate operations. Moreover, the multiplier-accumulator circuitry further facilitates concatenating the multiply and accumulate operations thereby allowing a plurality of multiplier-accumulator circuitry to perform such operations more quickly. The extent or length of the concatenation (i.e., number of multiplier-accumulator circuits interconnected to implement or perform the multiply and accumulate operations) may be adjusted (i.e., increased or decreased), for example, in situ (i.e., during operation of the integrated circuit), for example, to meet system requirements or constraints (e.g., temporal-based requirements of system performance).

In another aspect, the present inventions are directed to an integrated circuit having a plurality of multiplier-accumulator circuits and techniques for operating such circuits. In one embodiment, the integrated circuit is a field programmable gate array (FPGA) or embedded FPGA (herein collectively "FPGA"). Briefly, an FPGA is an integrated circuit that is configured and/or reconfigured (hereinafter, unless stated otherwise, collectively "configured" or the like (e.g., "configure" and "configurable")) by a user, operator, customer and/or designer before and/or after manufacture. The FPGA may include programmable logic components (often called "logic cells", "configurable logic blocks" (CLBs), "logic array blocks" (LABs), or "logic tiles"—hereinafter collectively "logic tiles")). In one embodiment of the present inventions, one or more (or all) logic tiles include a plurality of multiplier-accumulator circuits to implement multiply and accumulate operations, for example, in a pipelining manner. Moreover, one or more (or all) of the logic tiles may also include a switch interconnect network (which may be, e.g., configured as a hierarchical and/or mesh interconnect network), associated data storage elements, input pins and/or look-up tables (LUTs) that, when programmed, determine the configuration and/or operation of the switches/multiplexers and, among other things, the communication between circuitry (e.g., logic components) within a logic tile and/or between circuitry of multiple logic tiles.

The multiplier-accumulator circuits in the one or more (or all) of the logic tiles may also be connected and configured in a concatenation architecture to facilitate concatenating the multiply and accumulate operations thereby allowing a plurality of multiplier-accumulator circuitry to perform such operations more quickly. Indeed, in one embodiment, the integrated circuit includes multiplier-accumulator circuitry like that described above—i.e., a plurality of separate multiplier-accumulator circuits and a plurality of registers (including a plurality of shadow registers) that facilitate pipelining of the multiply and accumulate operations.

Moreover, in one embodiment, in addition to being connected in series (in concatenation architecture), the plurality of multiplier-accumulator circuits are organized into a plurality of rows, each row including a plurality of multiplier-accumulator circuits. The rows of multiplier-accumulator circuits may be connected or disconnected to adjust the extent or length of the concatenation (i.e., increase or decrease the number of multiplier-accumulator circuits interconnected to perform the multiply and accumulate operations).

In one embodiment, the switch interconnect network directly connects to at least one multiplier-accumulator circuit in each row of multiplier-accumulator circuits to, among other things, provide flexibility in configuring, adjusting, modifying and/or changing (i) which multiplier-accumulator circuits (and/or rows of multiplier-accumulator circuits) are employed and/or interconnected to implement or perform the multiply and accumulate operations and/or (ii) the number of multiplier-accumulator circuits that are employed and/or interconnected to perform the multiply and accumulate operations. As noted above, such configuration, selection, modification and/or adjustment may be implemented, for example, in situ (i.e., during operation of the integrated circuit) to, for example, meet or exceed temporal-based system requirements or constraints.

In one embodiment, the switch interconnect network may facilitate transmitting weight data to memory employed to store such data for access and use by the multiplier-accumulator circuits. In one embodiment, the switch interconnect network may facilitate transmitting weight data to memory of the multiplier-accumulator circuits for use in the multiplication operations. Moreover, the switch interconnect network may provide a conduit to/from logic circuitry of the associated logic tile or a different logic tile to/from multiplier-accumulator circuits (individually) of the rows of multiplier-accumulator circuits. Such conduit may be configurable and/or re-configurable—for example, in situ (i.e., during normal operation of the integrated circuit) and/or at or during power-up, start-up, initialization, re-initialization, configuration, re-configuration or the like.

Notably, the integrated circuit may be, for example, a processor, controller, state machine, gate array, system-on-chip (SOC), programmable gate array (PGA) and/or FPGA.

As mentioned above, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated in detail separately herein.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, or names illustrating like circuits, architectures, structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiments) is/are "example" embodiment(s).

Notably, the configurations, block/data width, data path width, bandwidths, data lengths, values, processes, pseudo-code, operations, and/or algorithms described and/or illustrated in the FIGURES, and text associated therewith, are exemplary. Indeed, the inventions are not limited to particular circuit, logical, block, functional and/or physical diagrams, block/data width, data path width, bandwidths, values, processes, pseudo-code, operations, and/or algorithms illustrated and/or described in accordance with, for example, the exemplary circuit, logical, block, functional and/or physical diagrams.

Figure 1A:
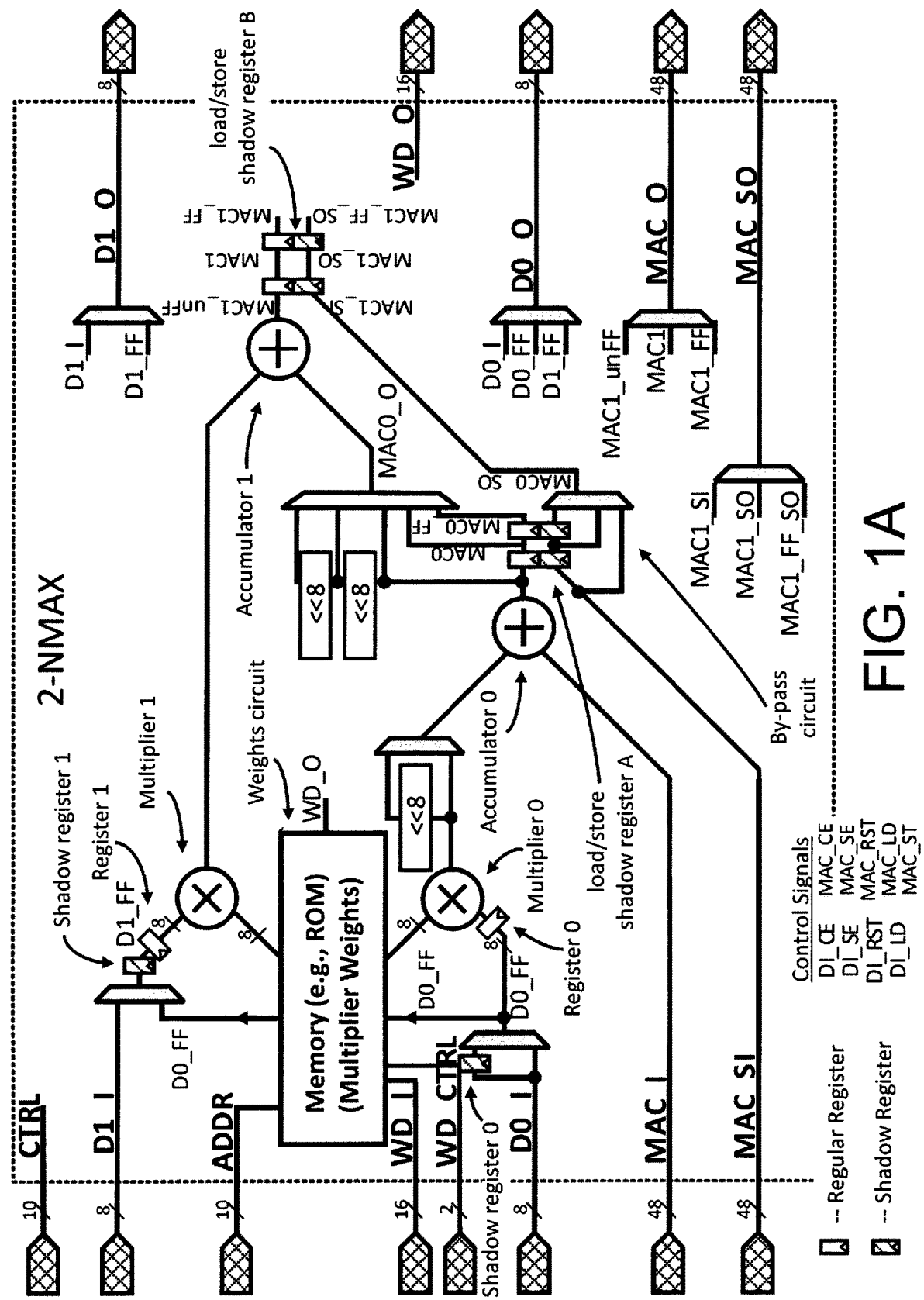
Figure 1B:
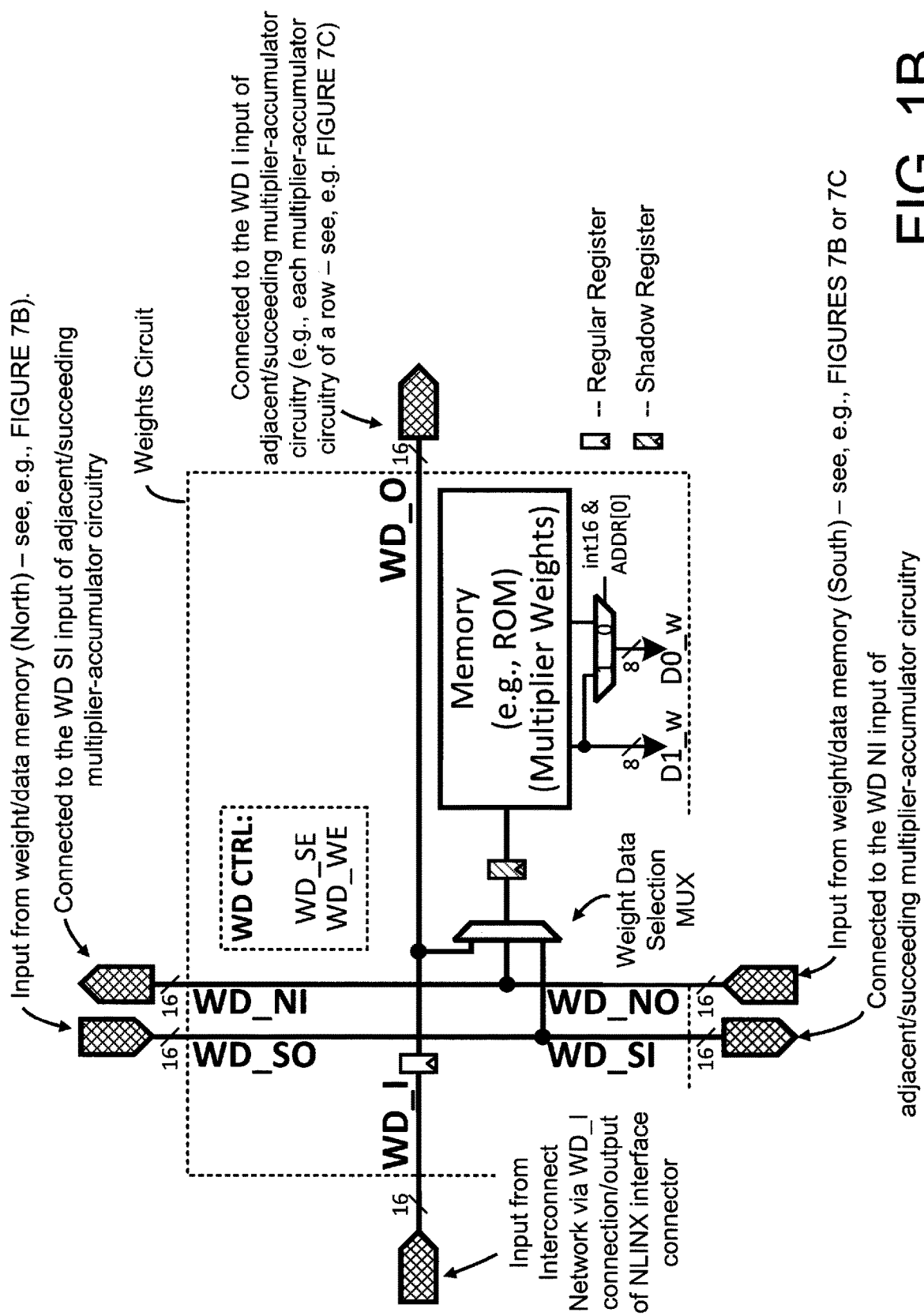
Figure 1C:
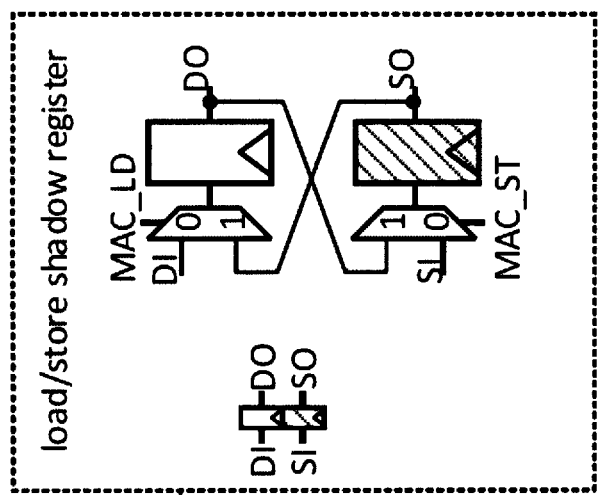
Figure 3:
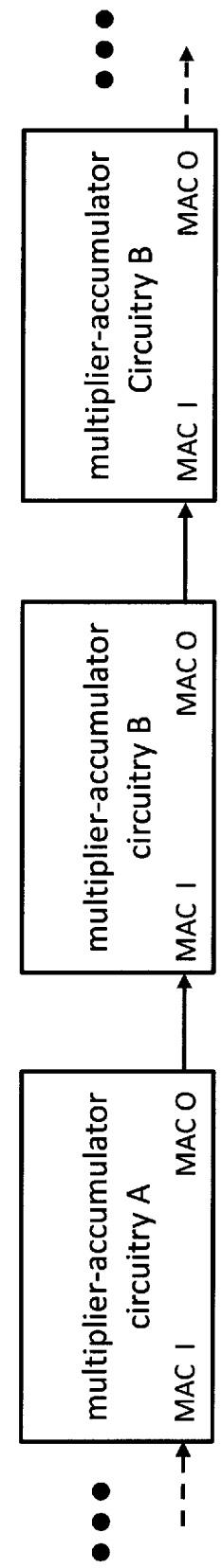
Figure 2C:
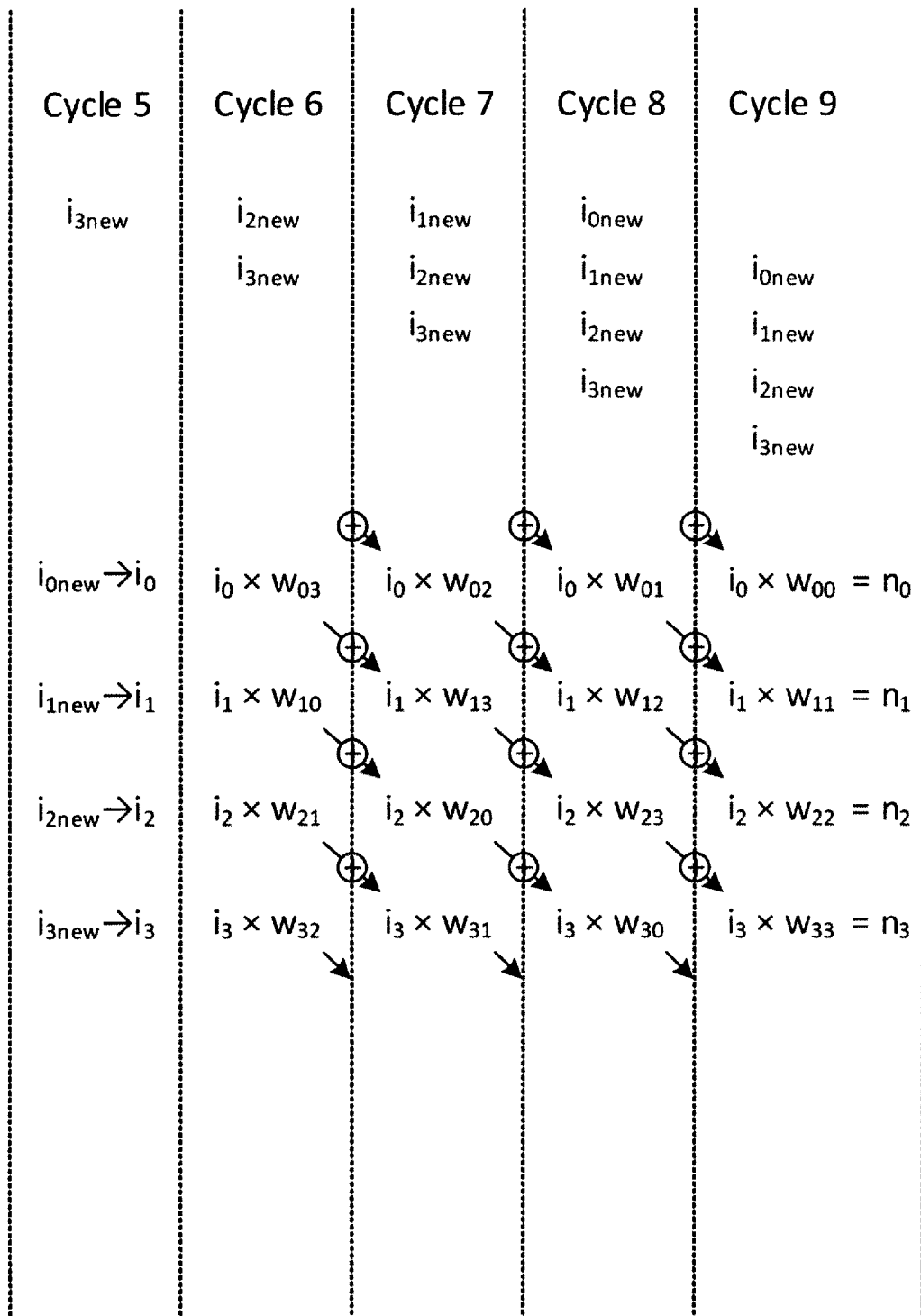
Figure 2D:
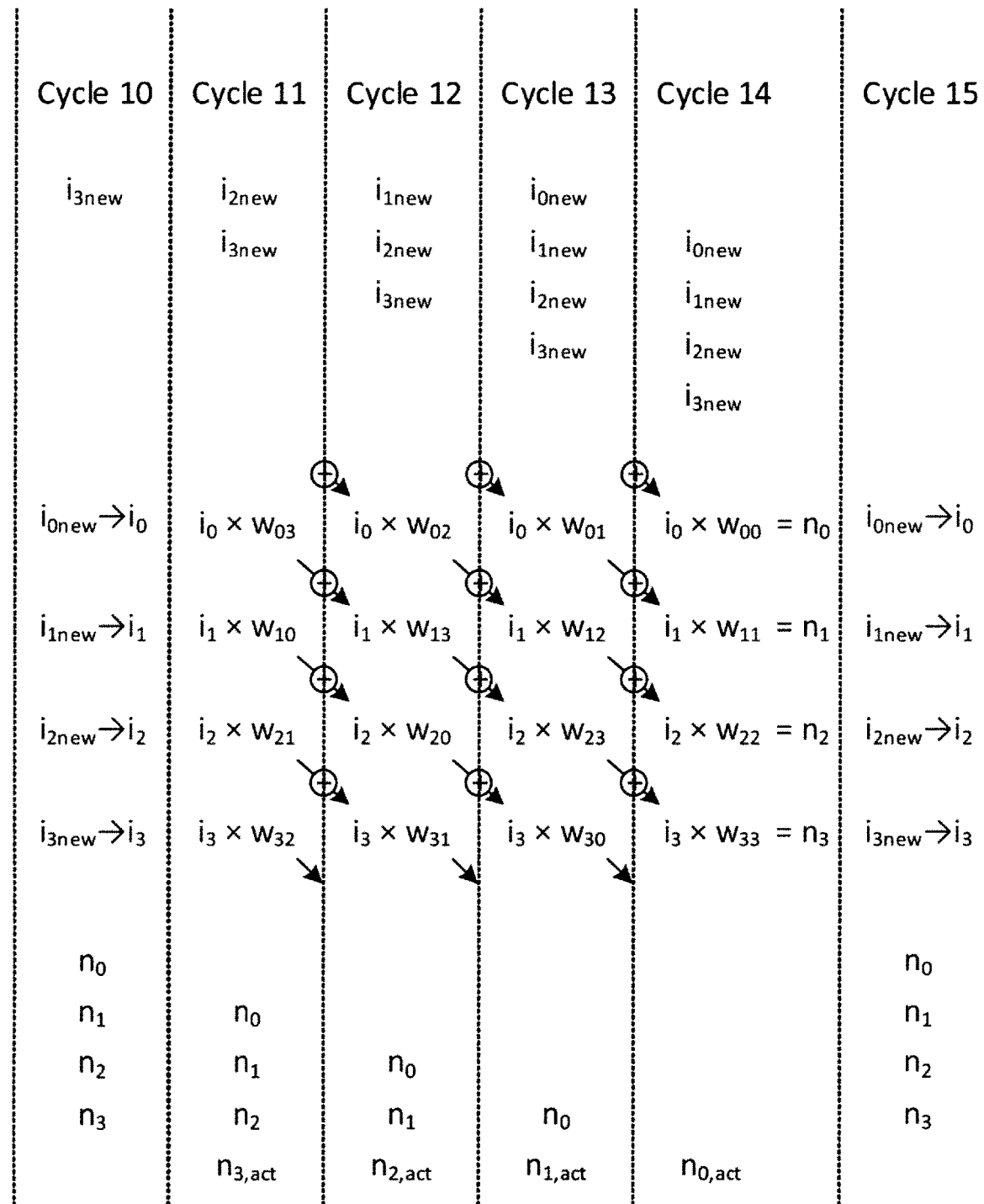
Figure 2E:
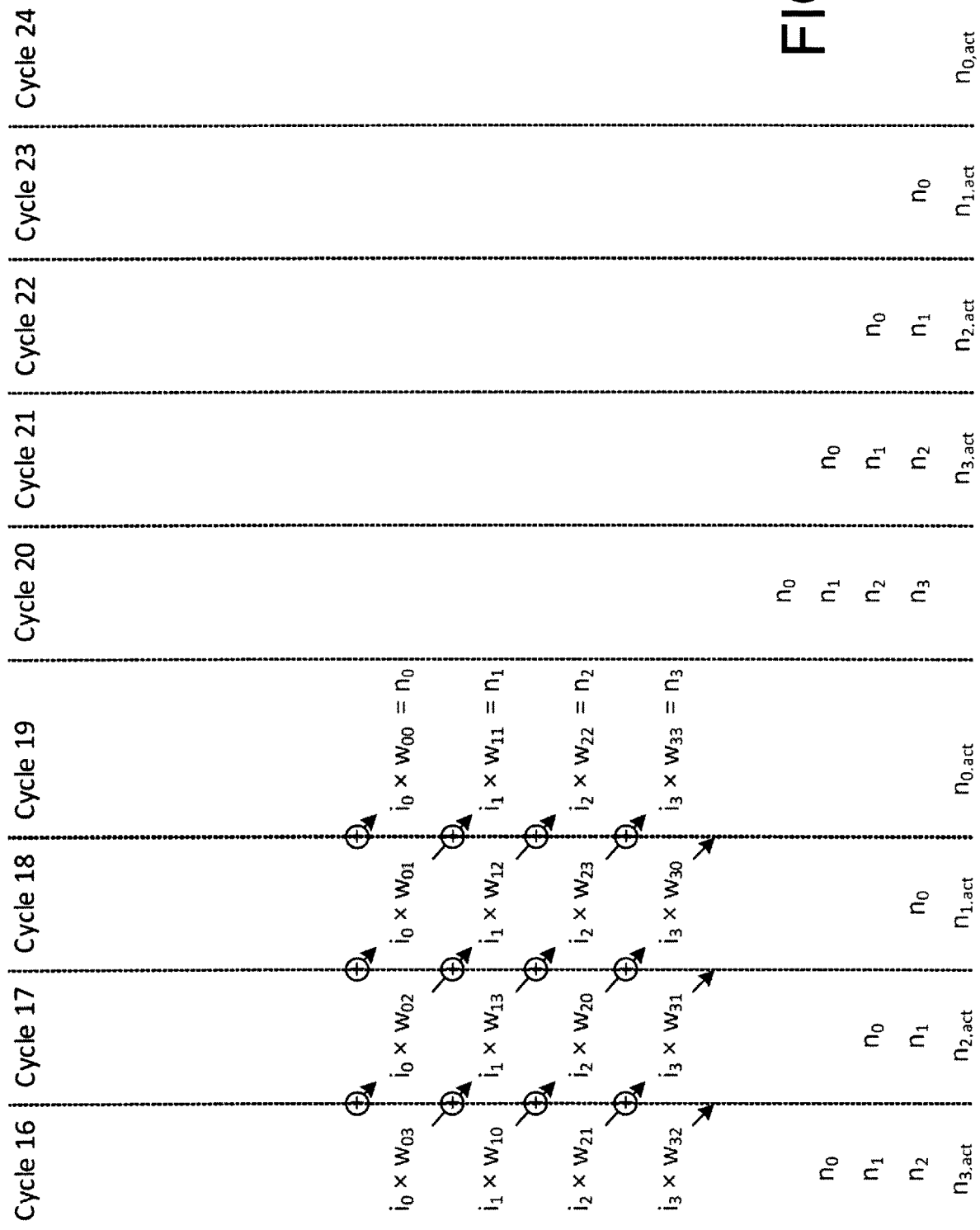
Figure 4:
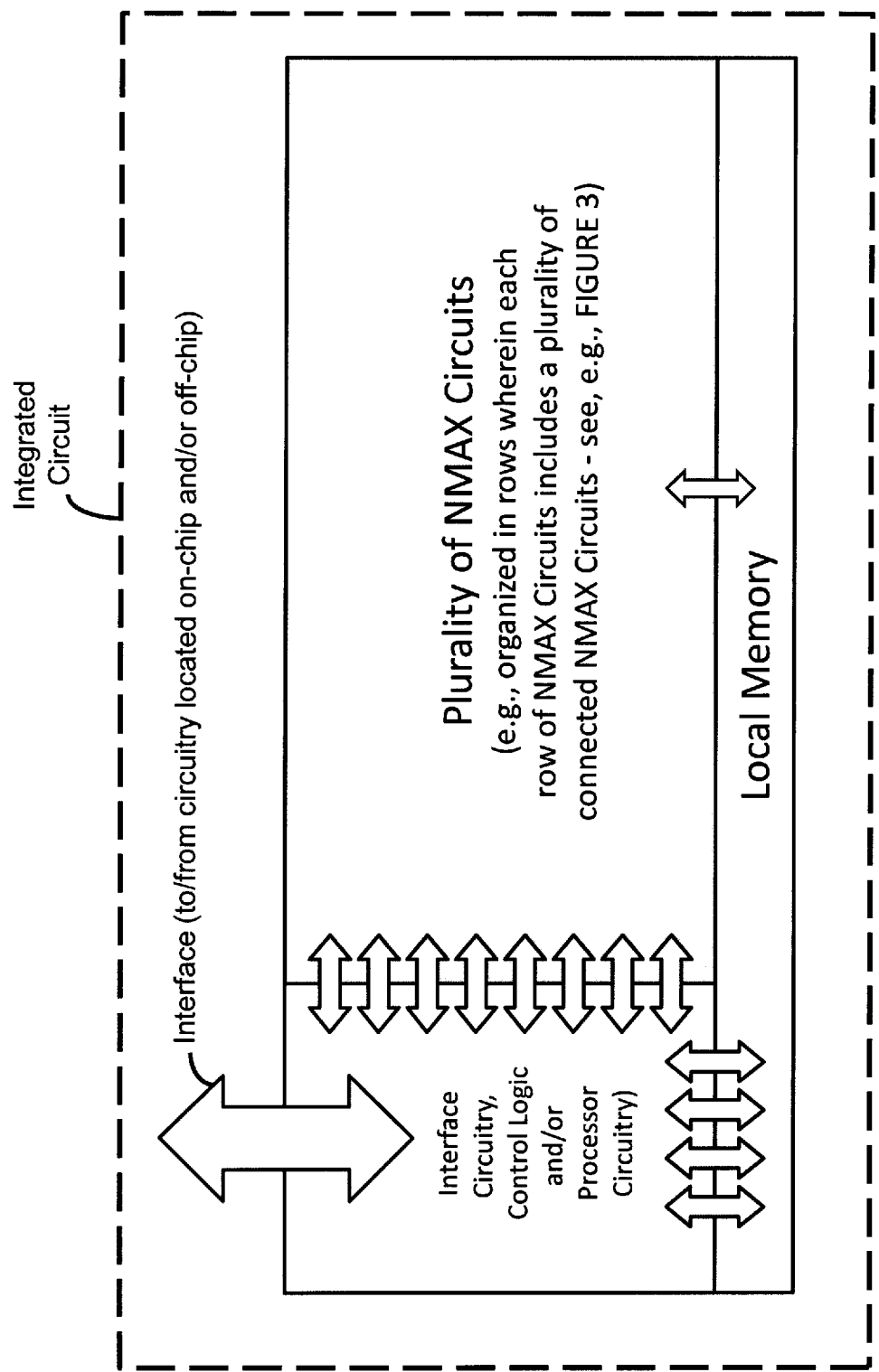
Figure 5A:
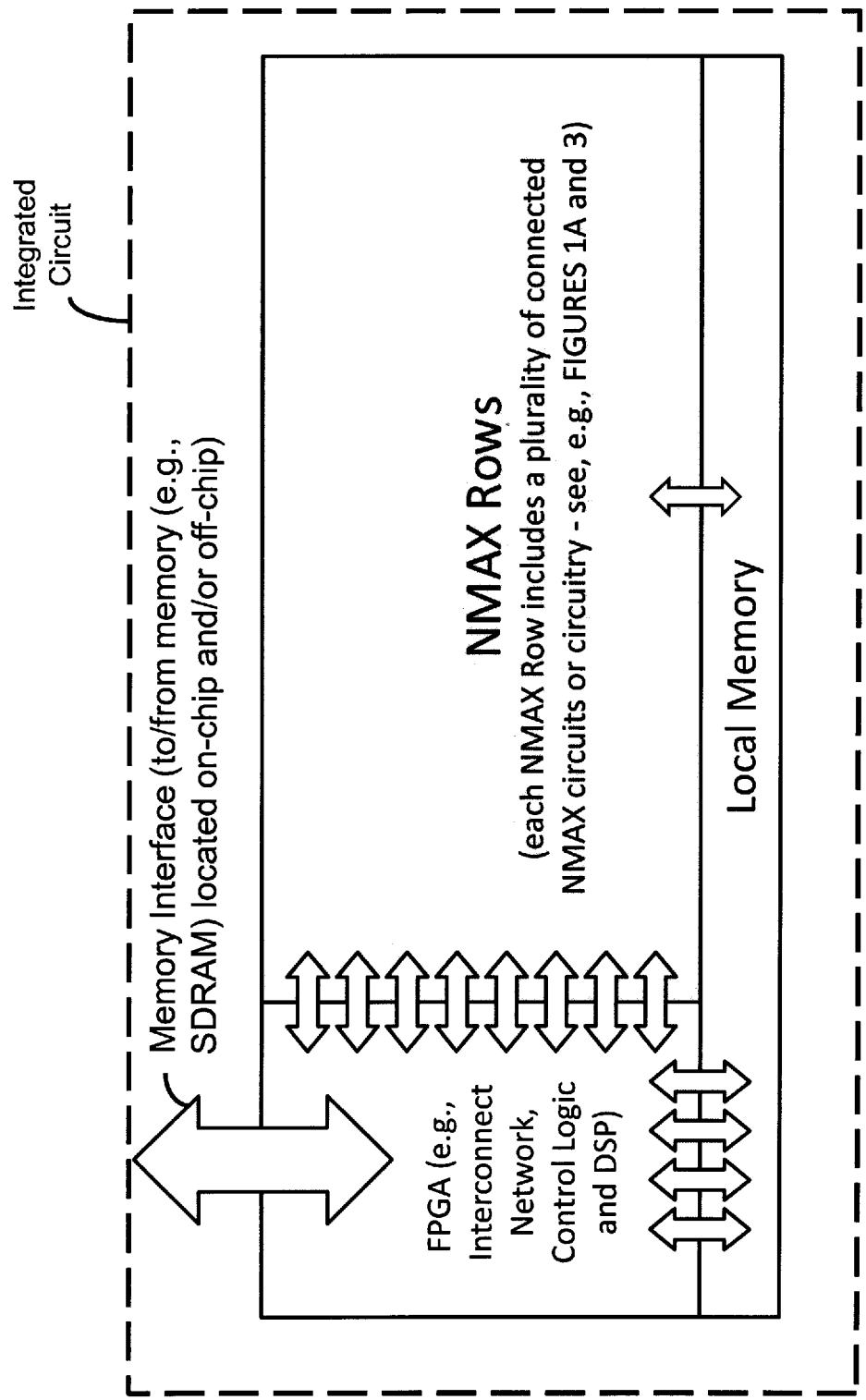
Figure 5B:
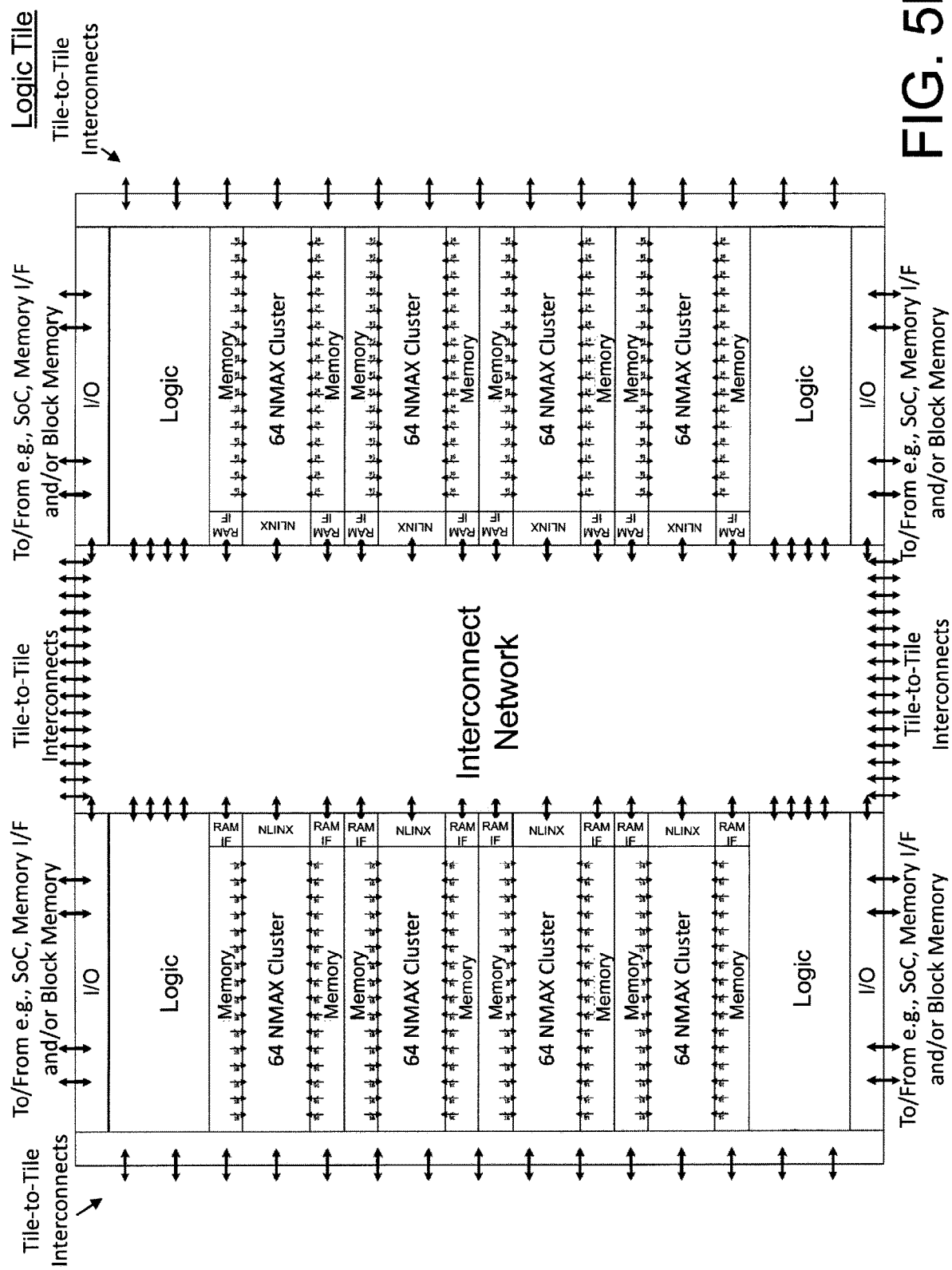
Figure 5C:
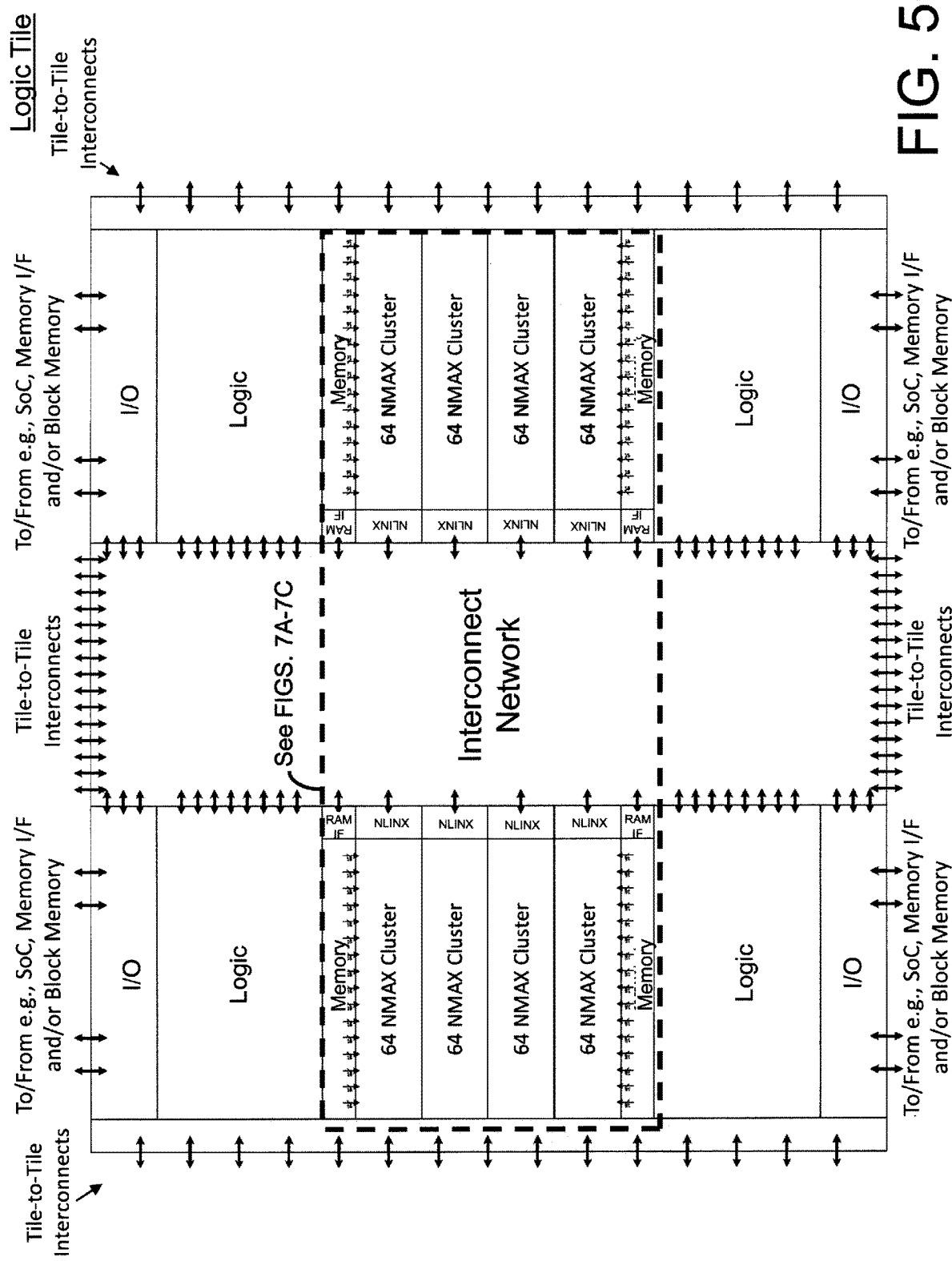
Figure 5D:
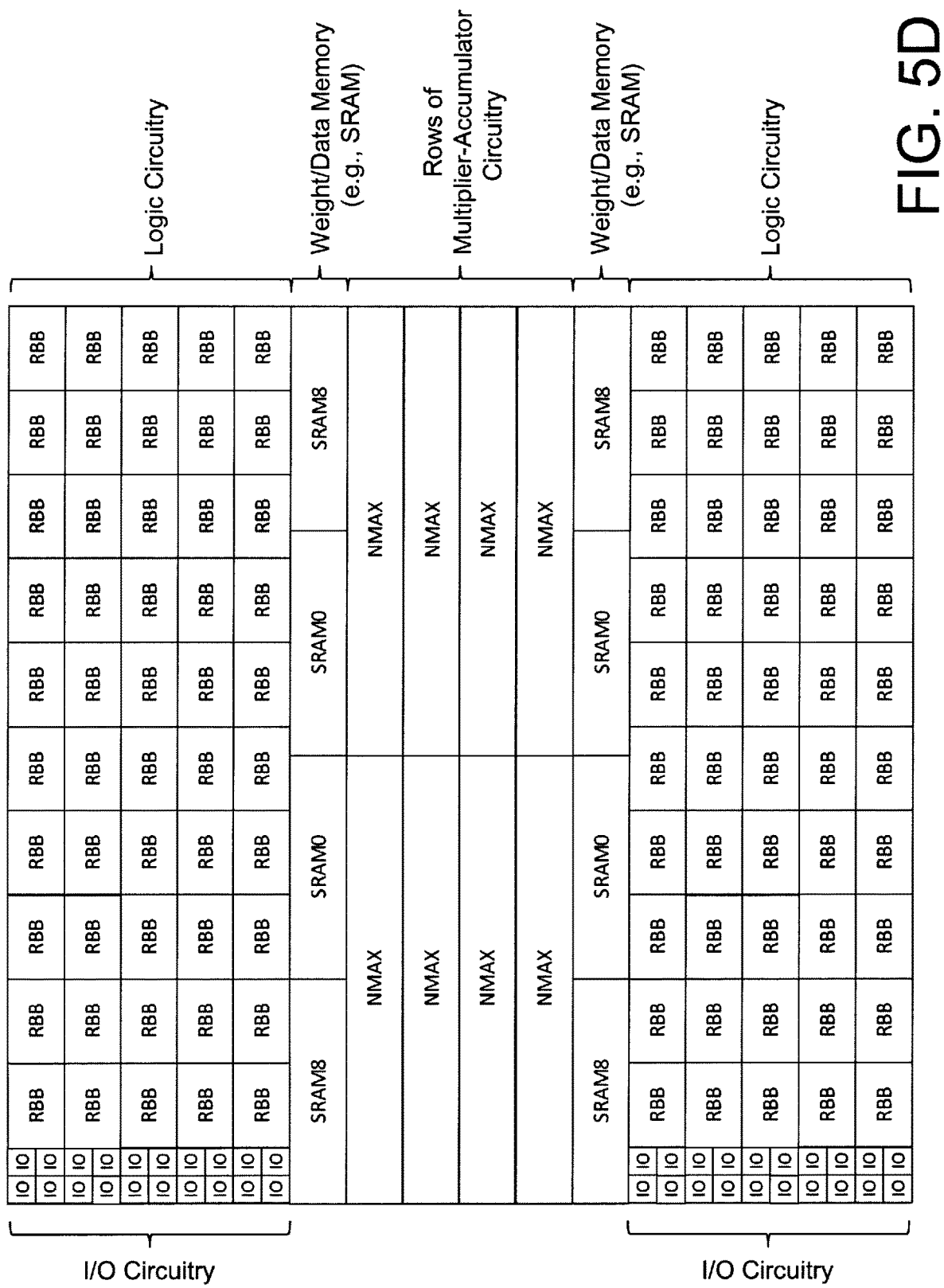
Figure 6A:
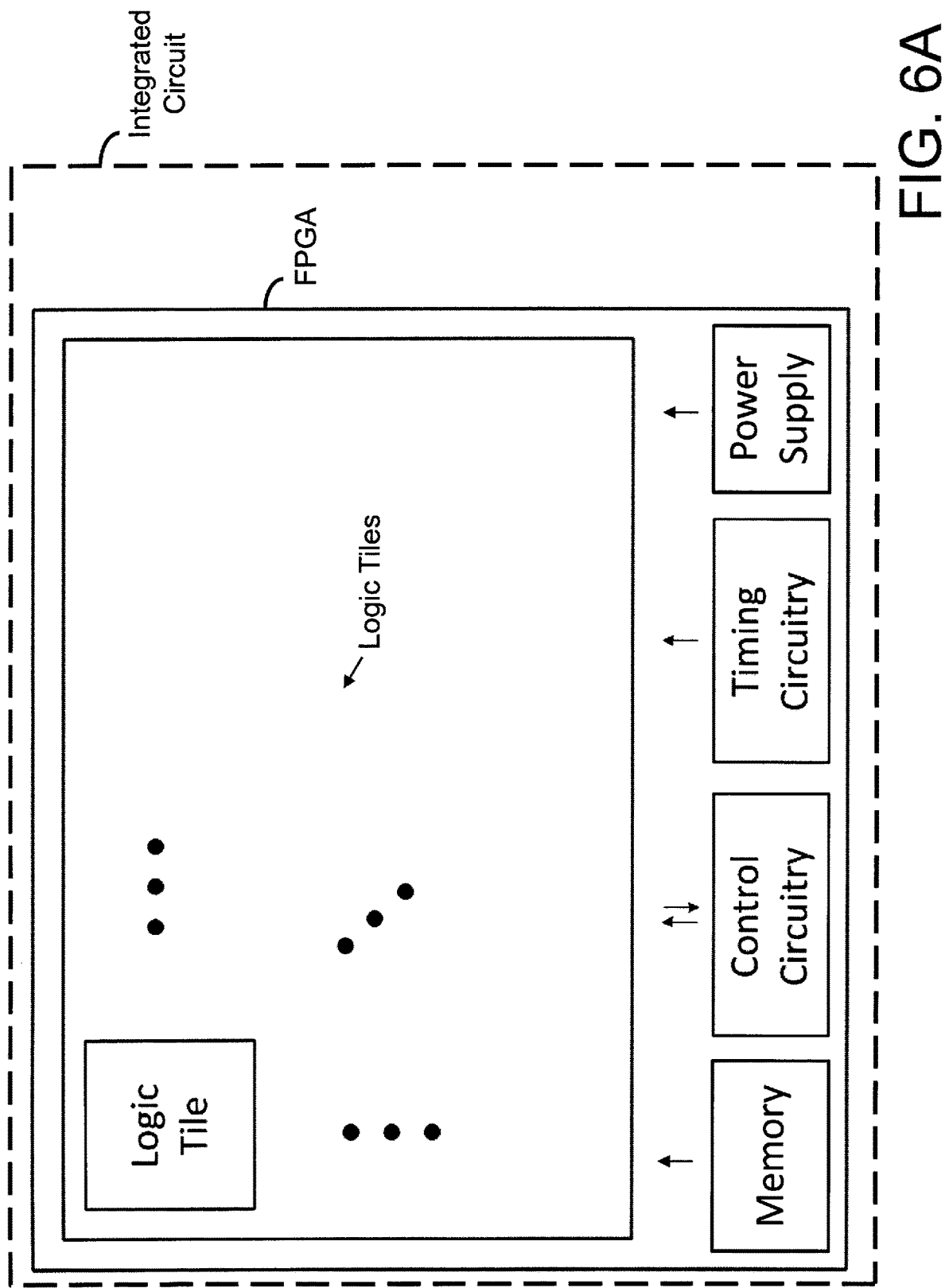
Figure 6B:
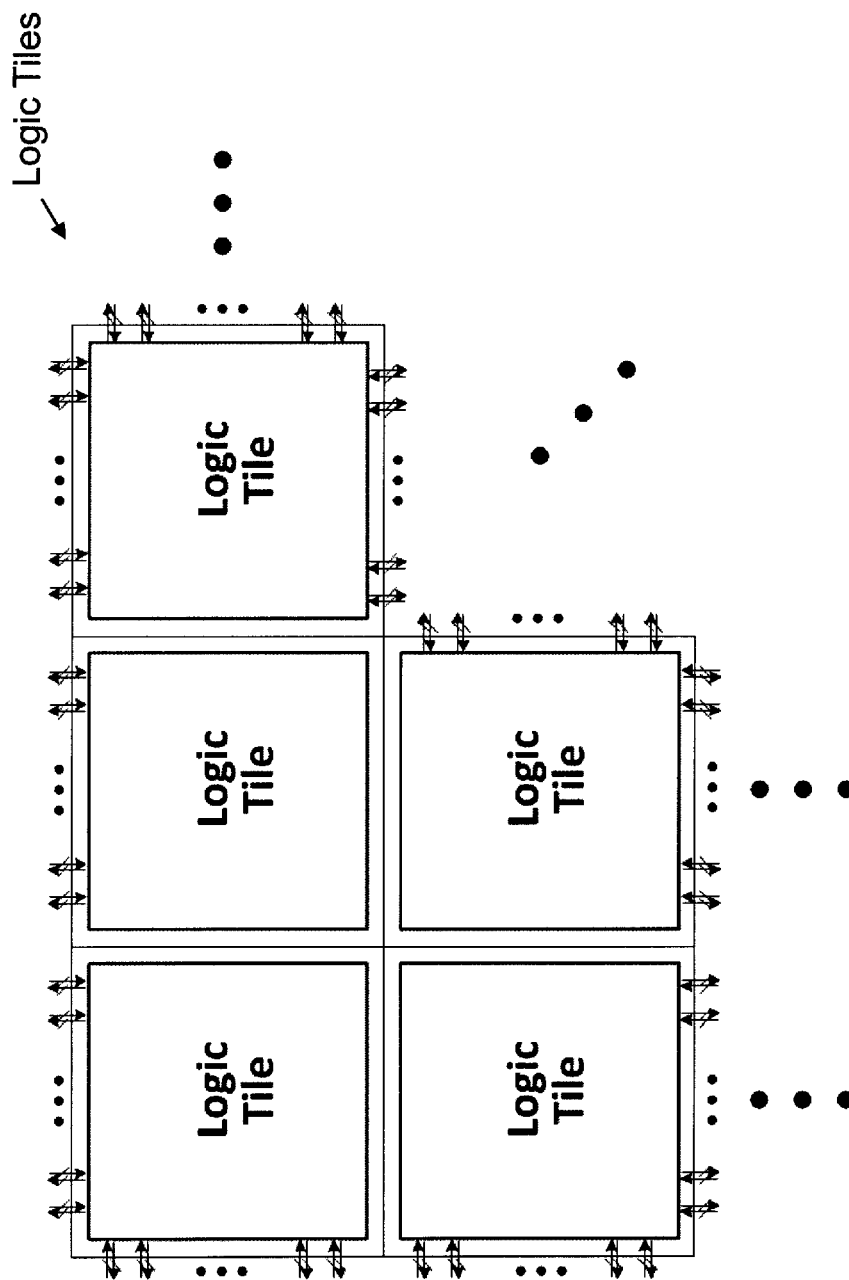
Figure 7A:
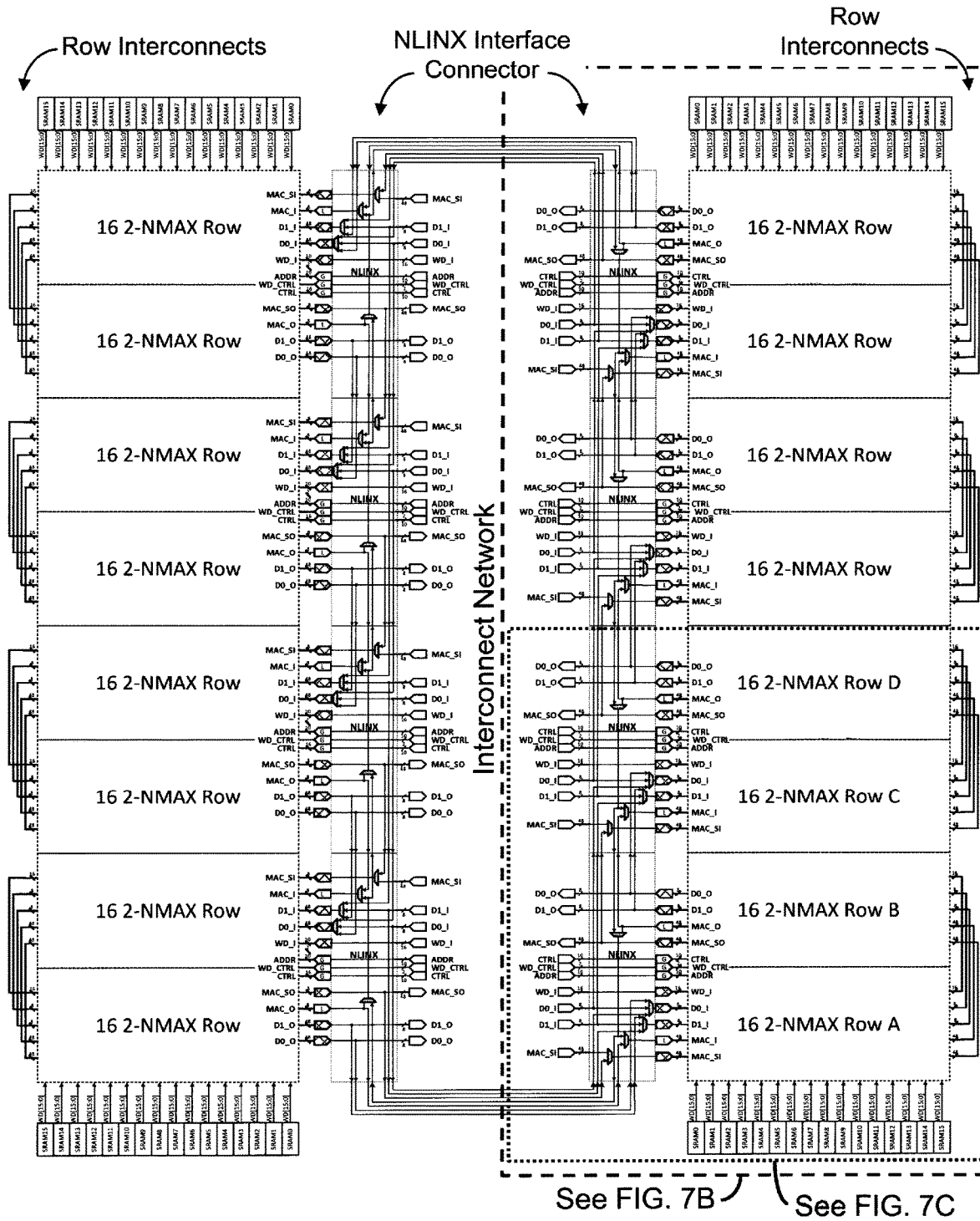
Figure 7B:
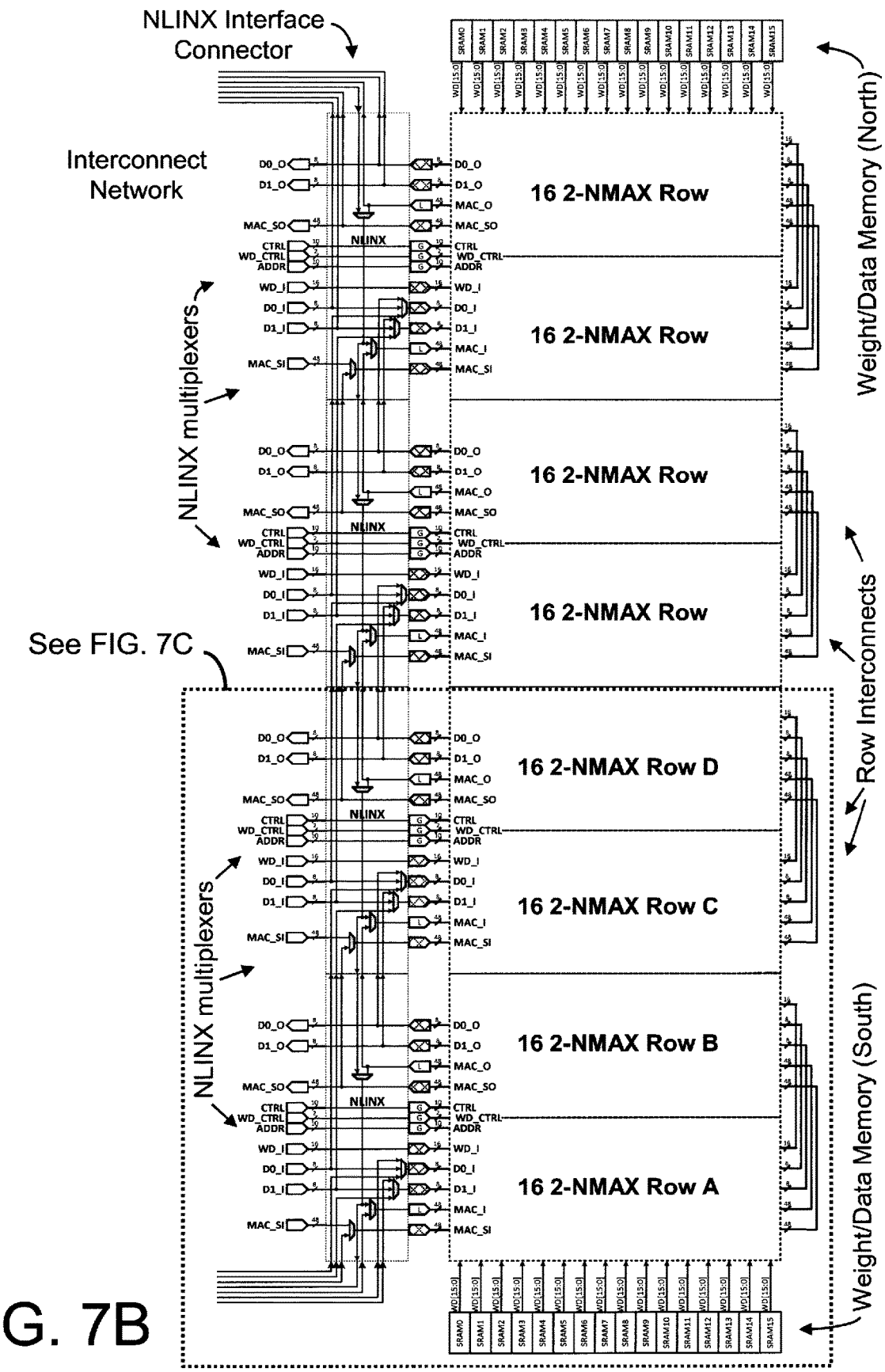
Figure 7C:
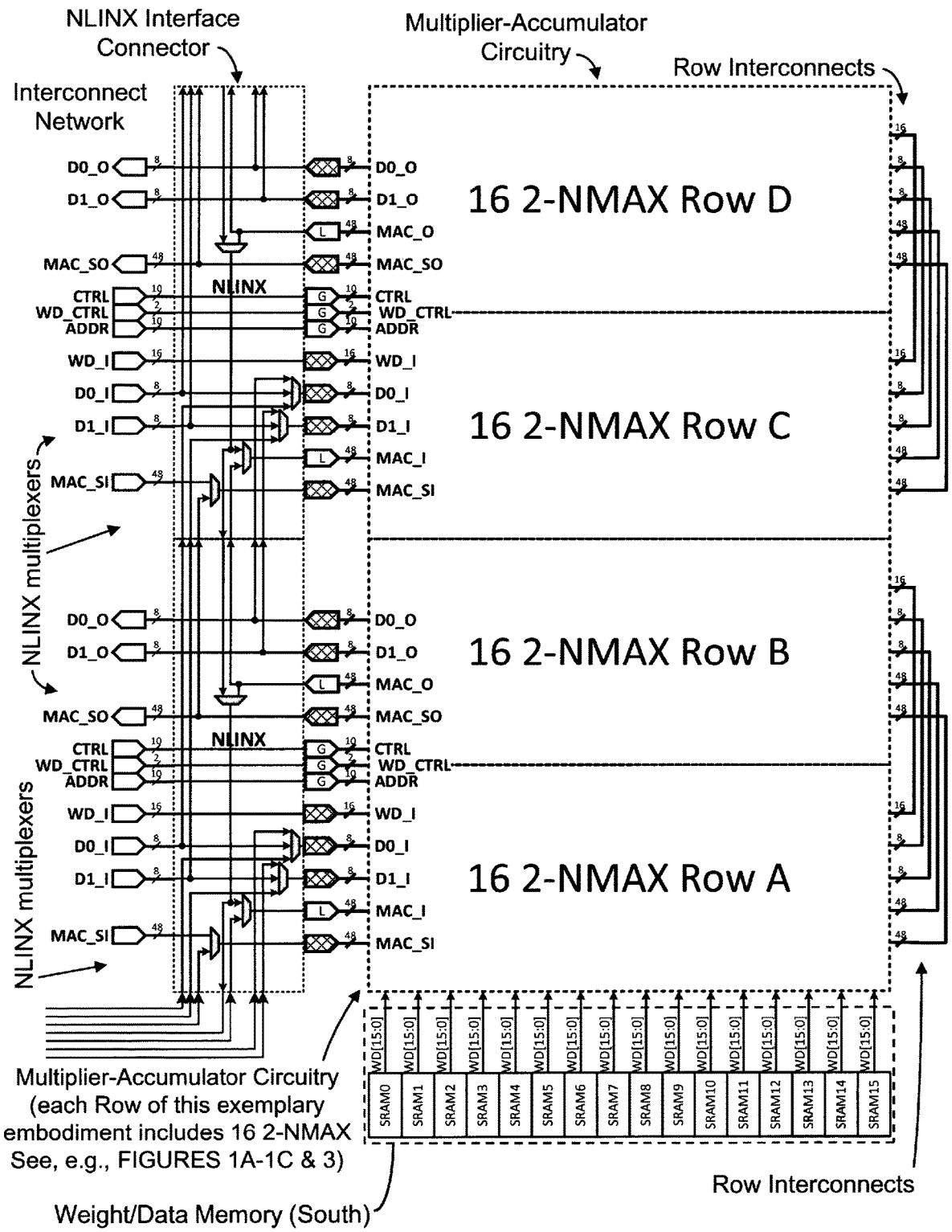

FIG. 1A is a schematic circuit-block diagram of an exemplary embodiment of multiplier-accumulator circuitry according to certain aspects of the present inventions, wherein, in this exemplary embodiment, the multiplier-accumulator circuitry includes two multiplier-accumulator circuits—a first including multiplier 0 and accumulator 0 and a second circuit including multiplier 1 and accumulator 1; in addition, the multiplier-accumulator circuitry further includes a plurality of shadow registers (including shadow register 0 and shadow register 1) that stores the input data until transferred to the registers (i.e., registers 0 and 1, respectively) for use by multiplier circuits multiplier 0 and multiplier 1, respectively; in this exemplary embodiment, the multiplier-accumulator circuitry also includes load/store registers that facilitate continual operation of the multiplier-accumulator circuitry while the data is shifting in and out (see, e.g., load/store shadow register A and load/store shadow register B); notably, the multiplier weights are stored in memory (e.g., ROM) and selectively provided (in relation to the input data associated therewith) to the multiplier 0 and multiplier 1, via address data (ADDR) provided to the multiplier-accumulator circuitry; the multiplier 0 and multiplier 1 perform the multiplication operations using the multiplier weights; in the illustrative embodiments, the multiplier-accumulator circuitry is, at times, labeled and referred to herein as "NMAX" or "2-NMAX";

FIG. 1B is a schematic circuit-block diagram of an exemplary embodiment of the weights circuit, according to certain aspects of the present inventions, of the exemplary embodiment of multiplier-accumulator circuitry of FIG. 1A; the weight data are provided to the multiplier circuits of the multiplier-accumulator circuitry via D1_w and D0_w to perform the multiplication operation; notably, in this embodiment, the weight data may be transferred or transmitted to the weights circuit via a plurality of paths/techniques (as discussed below) and thereafter storage into memory (e.g., ROM) of the weights circuit via weight data select multiplexer (MUX); in one embodiment, data may be input, transferred into the weight circuits via the interconnect network (WD_I); in another embodiment, data may be input or transferred via local connections through adjacent/succeeding multiplier-accumulator circuitry (WD_NI/WD_SI), which may be driven by, for example logic cells, memories, or other multiply-accumulators;

FIG. 1C is a schematic circuit diagram of an exemplary embodiment of a load/store register implemented in the exemplary embodiment of multiplier-accumulator circuitry of FIG. 1A, according to certain aspects of the present inventions; in one embodiment, the load/store register facilitates continual operation of the multiplier-accumulator circuitry while the data is shifting in and out (see, e.g., load/store shadow register A and load/store shadow register B in FIG. 1A); in this exemplary embodiment, the load/store register allows data transfer between the "white" regular register and the "shaded" (or "hashed"—hereinafter the shaded or hashed shift-registers are referred to as "shaded" shift-register) shadow shift-register; for example, when the multiply and accumulate operations of the multiplier-accumulator circuitry is complete, the output data are first stored in the "white" regular registers wherein MAC_ST control signal then allows data transfer from the white regular registers unto/into the "shaded" shift-registers; MAC_LD is employed to transfer data from the "shaded" shift-registers unto/into the "white" regular registers; notably, both MAC_ST and MAC_LD may occur in the same clock cycle, in which case the data in the "white" regular registers and "shaded" shift-registers are swapped;

FIG. 2A illustrates an exemplary timing diagram of exemplary multiplication—accumulation operations of multiplier-accumulator circuitry (e.g., the operation of circuitry of FIG. 1A), in accordance with an embodiment of certain aspects of the present inventions; notably, in this embodiment, the multiplier-accumulator circuitry is configured in a pipeline architecture wherein input data is loaded or clocked into the multiplier-accumulator circuitry, while other data is loaded or clocked into or transferred to the registers for use by circuitry implementing or performing the multiply-and-accumulate operations, while other data is stored from the multiplier-accumulator circuitry as output data and unloaded (that is, shifted to output MAC_SO of FIG. 1A); the aforementioned processes continue in a pipelined fashion; certain of the information identified on the exemplary timing diagrams (e.g., number of operations, number of cycles and amount of time) are merely exemplary (e.g., in certain respect, pertinent to the exemplary architecture of the multiplier-accumulator circuitry of FIG. 1A); such information is not intended to be limiting, in any way, to the scope of the present inventions;

FIGS. 2B-2E each illustrate selected portions, as identified in FIG. 2A, of the exemplary timing diagram of exemplary multiplication—accumulation operations of multiplier-accumulator circuitry (e.g., the operation of multiplier-accumulator circuitry of FIG. 1A), in accordance with an embodiment of certain aspects of the present inventions;

FIG. 3 illustrates a block diagram of a plurality of interconnected multiplier-accumulator circuitry, having a plurality (e.g., two) multiplier-accumulator circuits—for example, a first including multiplier 0 and accumulator 0 and a second circuit including multiplier 1 and accumulator 1, like that of FIG. 1A, according to an embodiment of certain aspects of the present inventions, to perform/implement the multiply and accumulate operations in a concatenated manner (see, e.g., FIGS. 2A and 11A) wherein, in this illustrated embodiment, each multiplier-accumulator circuitry outputs/provides a partially completed operation (e.g., at output MAC O—see, e.g., FIG. 1A) to an input (e.g., at input MAC I—see, FIG. 1A) of a successive multiplier-accumulator circuitry to advance the process, in a concatenated manner, towards completion; notably, the multiplier-accumulator circuitry (having a plurality (e.g., two) multiplier-accumulator circuits) of FIG. 1A may be considered a MAC design cell wherein a plurality of interconnected multiplier-accumulator circuitry is connected, in a concatenation architecture, to perform/implement the multiply and accumulate operations; in certain configurations (programmed in-situ or re-configured), the output (e.g. MAC_O) of a subsequent or later multiplier-accumulator circuit (e.g., the final multiplier-accumulator of a series) is concatenated back to the input of a preceding multiplier-accumulator circuit (e.g., the first (e.g. MAC_I) of the first multiplier-accumulator of the series) to complete or implement the desired multiplier-accumulator circuitry of a certain configuration;

FIG. 4 illustrates a functional block diagram of an exemplary integrated circuit (e.g., a discrete or embedded processor, controller, state machine, gate array, SOC, PGA and/or FPGA) including a plurality of multiplier-accumulator circuits each of which implement multiply and accumulate operations, according to certain aspects of the present inventions; in one embodiment, the plurality of multiplier-accumulator circuits (e.g., a plurality of the multiplier-accumulator circuitry of FIG. 1A) are interconnected in a manner that implements pipelining processing and a concatenation architecture;

FIG. 5A illustrates a functional block diagram of an exemplary discrete FPGA integrated circuit or embedded FPGA integrated circuit (e.g., an integrated circuit including an FPGA and processor such as a digital signal processor), according to certain aspects of the present inventions, wherein the integrated circuit includes a plurality of multiplier-accumulator circuits each of which implement multiply and accumulate operations; in one embodiment, the plurality of multiplier-accumulator circuits (e.g., a plurality of the multiplier-accumulator circuitry of FIG. 1A) are interconnected in a manner that implements pipelining processing and a concatenation architecture; in one embodiment the FPGA includes a plurality of logic tiles in addition to control circuitry, timing or clock circuitry, and power supply circuitry; notably, each logic tile may include switches/multiplexers having two or more inputs which are electrically interconnected to form a switch interconnect network (e.g., which may be configured as a hierarchical and/or mesh interconnect network), associated data storage elements, input pins and/or look-up tables (LUTs) that, when programmed, determine the operation of the switches/multiplexers; in one embodiment, one or more (or all) of the logic tiles includes one or more computing elements (e.g., a plurality of multiplier-accumulator circuitry—labeled as "NMAX Rows" in FIG. 5A and "NMAX Cluster" in the logic tile layout or physical floorplan illustrated in FIGS. 5B and 5C), and a switch interconnect network (e.g., a mixed-mode interconnect network (i.e., a hierarchical switch matrix interconnect network and a mesh, torus or the like interconnect network (hereinafter collectively "mesh network" or "mesh interconnect network"));

FIGS. 5B and 5C illustrates an exemplary layout or floorplan of one or more (or all) of the logic tiles of the exemplary integrated circuit of FIG. 5A, according to certain aspects of the present inventions, wherein the plurality of multiplier-accumulator circuits (e.g., a plurality of the multiplier-accumulator circuitry of FIG. 1A) are labeled as "NMAX Cluster"; notably, the tile-to-tile interconnects are employed to electrically connect to one or more logic tiles (e.g., logic tiles that are physically located or disposed adjacent thereto) and, in one embodiment, connect the switch interconnect networks of the one or more logic tiles (e.g., connect the switch interconnect networks of logic tiles that are physically located or disposed adjacent thereto); moreover, in one embodiment, the NMAX Clusters (i.e., the plurality of multiplier-accumulator circuits (e.g., a plurality of the multiplier-accumulator circuitry of FIG. 1A) are also connected to the interconnect network and, as such, to logic circuitry of the FPGA and the processor as well as the NMAX Clusters, logic circuitry of the FPGA and the processor of other logic tiles (e.g., logic tiles that are physically located or disposed adjacent thereto); in addition, the NMAX Clusters are directly connected to memory disposed adjacent or located thereto;

FIG. 5D illustrates an exemplary layout or floorplan of a logic tile (e.g., a tile having the layout of FIG. 5C) according to certain aspects of the present inventions, wherein, in one embodiment, the logic tile includes multiplier-accumulator circuitry, logic-memory and/or DSP cores and includes more than a thousand LUTs (e.g., 6-input LUTs) from hundreds of reconfigurable building blocks (RBBs), including Kb RAM, and hundreds of I/O blocks (e.g., 2-input, 2-output each); as intimated herein, the logic tiles may be "tiled" to form an array (e.g., like that in FIGS. 6A and 6B) wherein switch interconnect networks of the logic tiles are interconnected (e.g., via a mesh network of one of the stages of the mixed hierarchical-mesh interconnect network) via data stored in, for example, the LUTs; notably, as stated above, the inventions are not limited to a particular physical layout or floorplan, illustrated and/or implemented in accordance with, for example, the exemplary physical layouts or floorplans of FIGS. 5B-5D;

FIG. 6A illustrates a block diagram representation of, for example, an exemplary integrated circuit including control circuitry, timing or clock circuitry, power supply circuitry and programmable/configurable logic circuitry (which includes a plurality of logic tiles, one, some or all of which may include transistors configured to perform combinational and/or sequential functions (simple and/or complex), multiplier-accumulator circuitry (e.g., circuitry like that described and illustrated herein including, for example, the multiplier-accumulator circuitry of FIGS. 1A-1C) and circuitry to implement techniques for operating such multiplier-accumulator circuitry (e.g., circuitry and techniques like that described and illustrated herein including, for example, the circuitry, timing and architecture intimated in FIGS. 2A-2E, 3, 5A-5D, 7A-7C, 8, 9, 10, and 11A-11E); one, some or all of which may also include transistors and circuitry (that may be interconnected, for example, as switches or multiplexers having two or more inputs which are electrically interconnected into a switch interconnect network (see, for example, the interconnect networks described and/or illustrated in U.S. Pat. No. 9,503,092 and U.S. Provisional Patent Application No. 62/735,988; the '092 patent and '988 application are incorporated herein by reference) as well as connected to, for example, associated data storage elements, input pins and/or lookup tables that, when programmed, determine the operation and connectivity of the multiplexers)); notably, in one embodiment, each logic tile of the programmable/configurable logic circuitry includes a plurality of multiplexers which are electrically interconnected into a network (for example, a hierarchical network and/or mesh, torus or the like interconnect network (hereinafter collectively "mesh network"); the switch interconnect network of each logic tile may be connected to one or more other logic tiles of the array via a configurable mesh network; indeed, in one embodiment, the highest stage of the mixed-mode switch interconnect architecture is a mesh interconnect (here, a plurality of switch matrices of the highest stage of a logic tile is connected to one or more of the switch matrices of that stage in that logic tile and one or more switch matrices of the highest stage (i.e., mesh stage) in at least one other logic tile); the lower stages of interconnect network in each logic tile may implement a hierarchical network; this notwithstanding, another mesh network/stage may be implemented as a substitute and replacement of one or more of the hierarchical network of the lower stages;

FIG. 6B illustrates, among other things, a block diagram representation of a physical array of a plurality of logic tiles of, for example, an exemplary FPGA (as noted above "FPGA" may be a discrete or embedded FPGA), wherein input/output (I/Os) of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (for example, a hierarchical network and/or mesh network); notably, as intimated above, the logic tile interconnect network of each logic tile may include a plurality of switch matrices (e.g., an M×N switch matrix) arranged in a plurality of switch matrix stages or switch matrices stages which are interconnected into a logic tile interconnect network via logic tile interconnects (see, e.g., the interconnect networks described and/or illustrated in U.S. Pat. No. 9,503, 092 and U.S. Provisional Patent Application No. 62/735, 988)—accordingly, in one embodiment, the logic tiles are configurable to communicate, during operation of the integrated circuit, within the logic tile (e.g., between computing elements/circuitry) as well as with at least one other logic tile of the FPGA;

FIG. 7A illustrates a schematic circuit and block diagram, correlated to the layout of FIG. 5C, of certain features of an exemplary embodiment of a logic tile including a plurality of multiplier-accumulator circuits (e.g., a plurality of the multiplier-accumulator circuitry of FIG. 1A) are labeled as "2-NMAX Row", according to certain aspects of the present inventions; in this embodiment, the 2-NMAX Rows (i.e., the plurality of multiplier-accumulator circuits—e.g., a plurality of the multiplier-accumulator circuitry of FIG. 1A wherein much of the nomenclature/signal names is adopted or applied to the schematic circuit diagram of FIG. 7A) are also connected to an interconnect network that facilitates interfacing or communicating with the plurality of multiplier-accumulator circuits (e.g., individually or as a group (e.g., wherein a plurality of multiplier-accumulator circuits are configured in a concatenation architecture (e.g., as illustrated in FIG. 3) via the conductors of the NLINX interface connector); notably, in this illustrative embodiment, the plurality of interconnected multiplier-accumulator circuits of the row of multiplier-accumulator circuits are directly connected (that is, without connection through or via the interconnect network) to an adjacent row via row interconnects to facilitate pipelining processing and provide a concatenation architecture; in one embodiment, the row interconnects directly connect the output of last multiplier-accumulator circuit of a first row of multiplier-accumulator circuits to the input of a first multiplier-accumulator circuit of a second row of multiplier-accumulator circuits; in addition thereto, the NLINX interface connector may be configured to connect adjacent and/or non-adjacent rows of multiplier-accumulator circuits to facilitate pipelining processing and provide a concatenation architecture; for example, route selection circuitry (e.g., multiplexer(s)) of the NLINX interface connector may be configured to connect the output of last multiplier-accumulator circuit of a row of multiplier-accumulator circuits to an input of a first multiplier-accumulator circuit of one or more different rows (adjacent and/or non-adjacent) of multiplier-accumulator circuits; as noted above, in one embodiment, the interconnect network connects the plurality of multiplier-accumulator circuits (e.g., a plurality of the multiplier-accumulator circuitry of FIG. 1A) to logic circuitry of the logic tile, circuitry of other logic tiles (e.g., logic tiles that are physically located or disposed adjacent thereto) and/or circuitry of the FPGA; in addition, in this illustrative embodiment, the multiplier-accumulator circuits of the NMAX Rows are directly connected to memory disposed on-chip (e.g., adjacent thereto and/or located at the edges of the top and bottom rows of multiplier-accumulator circuits—see, e.g. FIGS. 5B and 5C) to receive, for example, weight data for use in the multiplication operations; the rows of multiplier-accumulator circuit receive, for example, weight data and/or forward such data to the adjacent row of multiplier-accumulators (FIG. 1B); notably, the schematic circuit diagram of FIG. 7A may be implemented to realize the functional block diagram of an exemplary discrete FPGA integrated circuit or embedded FPGA integrated circuit (e.g., an integrated circuit including an FPGA and processor such as a digital signal processor) illustrated in FIG. 5A and may be implemented via the exemplary physical layout or floorplan of the logic tile illustrated in FIGS. 5C and 5D;

FIGS. 7B and 7C each illustrate selected portions, as identified in FIG. 7A, of the schematic circuit and block diagram of the exemplary logic tile of FIG. 7A; notably, NLINX multiplexers of the NLINX interface may be configured to interconnect one or more adjacent and/or non-adjacent rows of multiplier-accumulator circuits wherein an output of a row of multiplier-accumulator circuits (MAC_O) may be selectively connected to an input of a different row of multiplier-accumulator circuits (MAC_I); here, the NLINX interface connector, and specifically the NLINX multiplexers and NLINX conductors, in this illustrative embodiment, are configurable to interconnect rows of multiplier-accumulator circuits whereby the NLINX multiplexers may controlled to connect an output of last multiplier-accumulator circuit of a row of multiplier-accumulator circuits to an input of a first multiplier-accumulator circuit of a different row of multiplier-accumulator circuits; for the avoidance of doubt, as stated above, the inventions are not limited to a particular circuit or block, layout and/or physical diagrams, block/data width, data path width, bandwidths and/or values, illustrated and/or implemented in accordance with, for example, the exemplary circuit diagram of FIGS.

Figure 8:
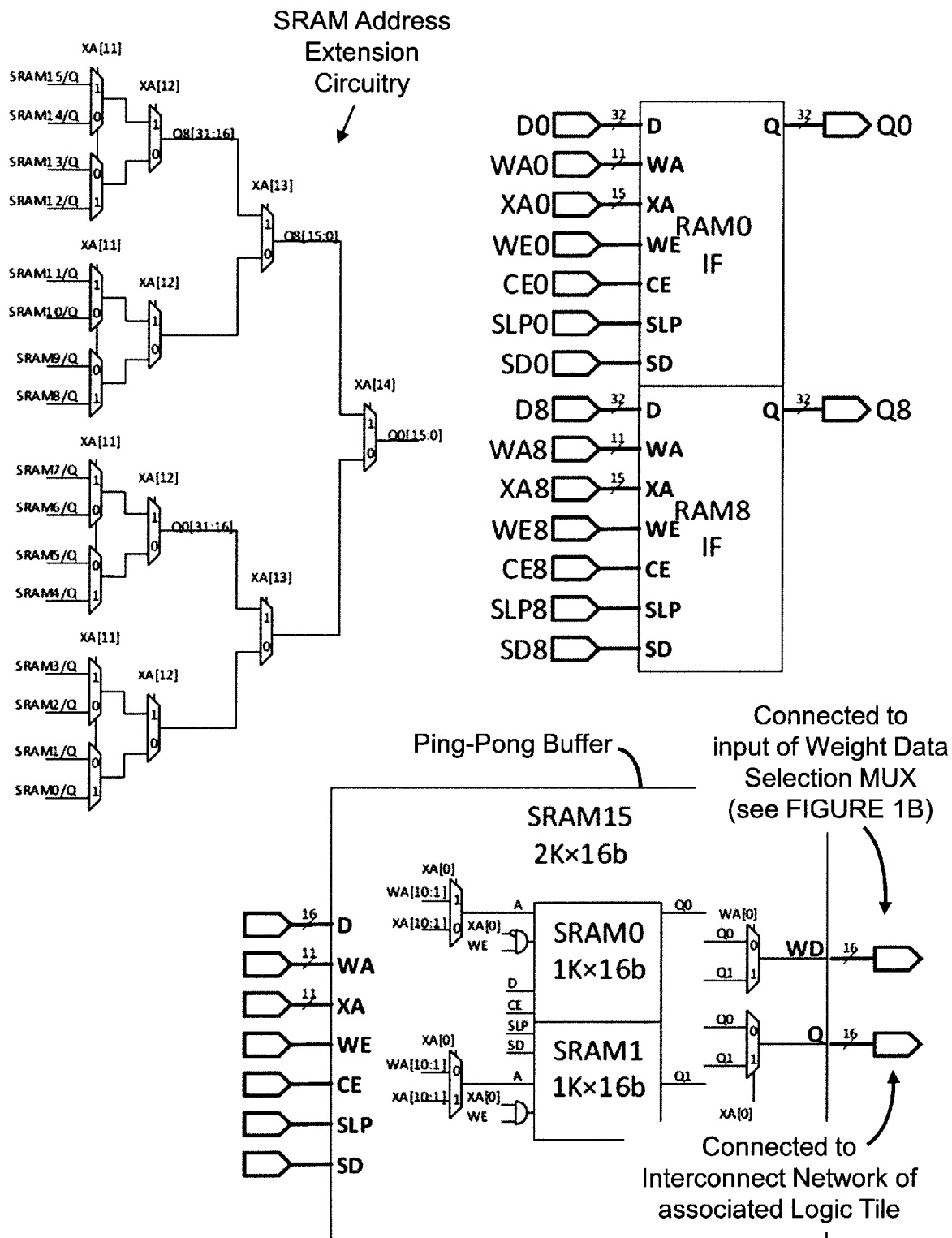
Figure 9:
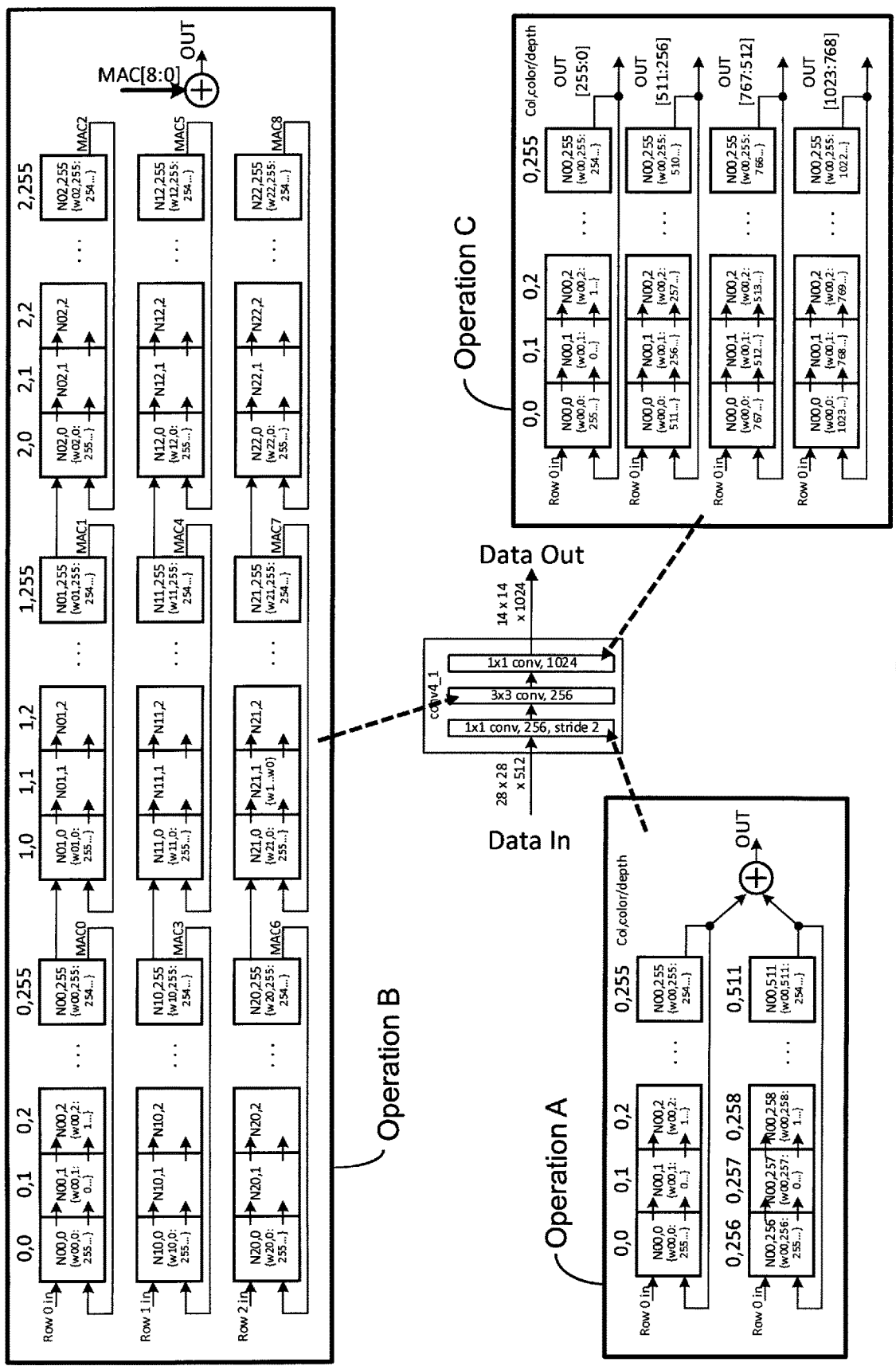
Figure 10:
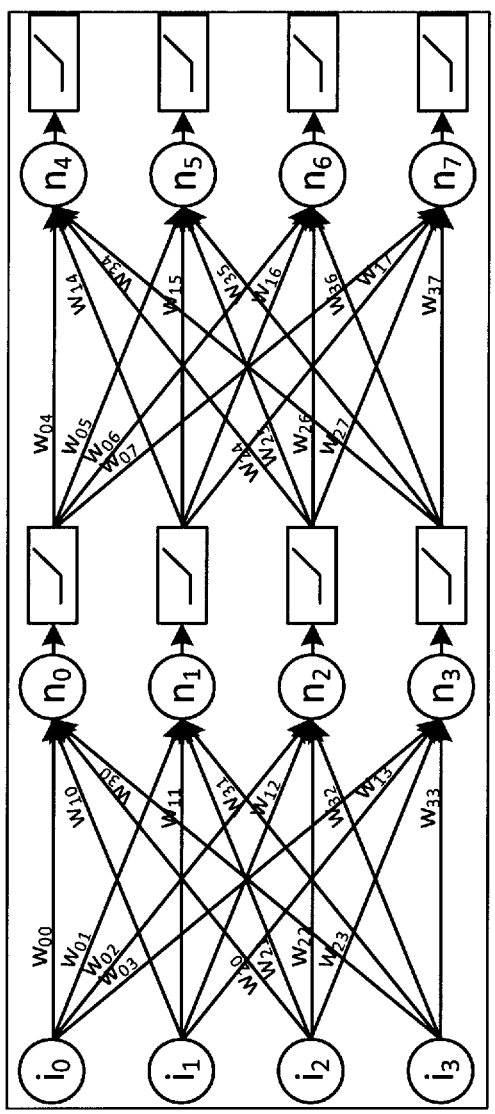
Figure 11C:
Figure 12:
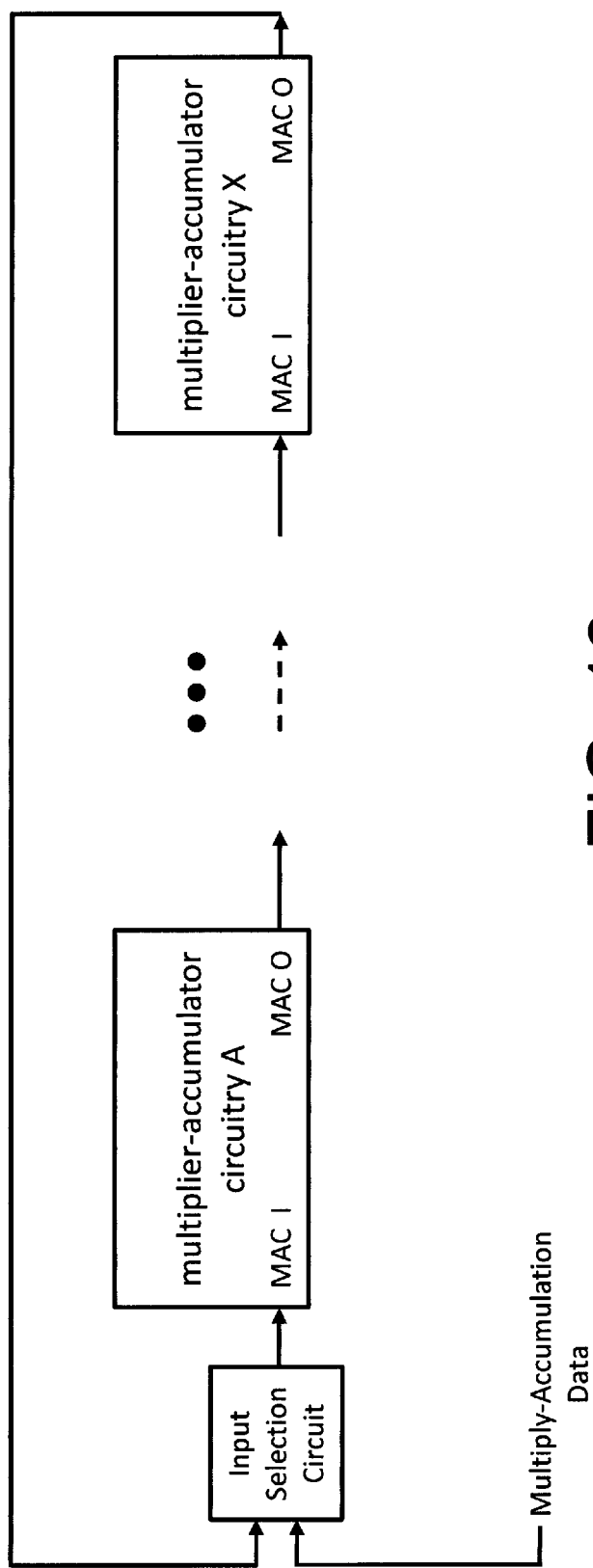

7A-7C; for example, although the plurality of multiplier-accumulator circuits are described/illustrated as a "row" of multiplier-accumulator circuits, the plurality may be described as a "column" of multiplier-accumulator circuits where the layout of the plurality of multiplier-accumulator circuits were vertical; both of which are intended to fall within the scope of the present inventions;

FIG. 8 illustrates a schematic circuit diagram of an exemplary embodiment of data extension circuitry and address extension circuitry for memory (e.g., SRAM) of, for example, the weight/data memory associated with multiplier-accumulator circuits of, for example, one or more rows of multiplier-accumulator circuits illustrated in, for example, the logic tile of FIG. 7A, according to one embodiment certain aspects of the present inventions; notably, the data extension circuitry effectively increases the data output by the memory (effectively wider than each individual SRAM data ports), thereby permitting the data representative of the multiplier weights to write data in parallel into the weight/data SRAM banks which accelerates the operations of writing the appropriate data into the weight/data SRAM banks; address extension circuitry reduces the input/output pins/conductors employed to interface with the interconnect network of the logic tile; a ping-pong buffer permits an odd/even read-write technique/approach to facilitate writing and read data to/from each bank of SRAM at the same time, as long as the read address is odd and the write address is even, or vice versa; notably, address extension and data extension may be employed in one embodiment or configuration, such as writing the data into the SRAM banks via address extension, and thereafter transferring or reading the data from SRAM banks and writing the data into memory (e.g., ROM—see, e.g. FIG. 1A) of the multiplier-accumulator circuitry via data extension;

FIG. 9 illustrates an exemplary configuration of a plurality of multiplier-accumulator circuits, for example, of one or more logic tiles (e.g., logic tiles of FIGS. 5A-5D, 6A, 6B and 7A-7C), may be configured and re-configured (e.g., in situ (i.e., during operation of the integrated circuit)) to perform predetermined multiple-accumulate operations (e.g., operations typically performed by neural networks) including organized/configured into systolic arrays to implement the three layers of convolution (i.e., Operations A, B and C), according to certain aspects of the present invention; for example, the processing of Operation A may be implemented via two rows of interconnected multiplier-accumulator circuitry of 256 NMAX each, each would require eight rows of 16 2-NMAX rows (see, FIGS. 7A-7C); the result of Operation A (see OUT) is summed and may be stored in local memory and/or output to processing circuitry (e.g., a DSP) via the interconnect network of the logic tile for further data processing; the processing of Operation B may be implemented via nine rows of interconnected multiplier-accumulator circuitry of 256 NMAX each; the result of Operation B (see OUT) is summed and may also be stored in local memory and/or output to processing circuitry (e.g., a DSP) via the interconnect network of the logic tile for further data processing; and the processing of Operation C may be implemented via four rows of interconnected multiplier-accumulator circuitry of 256 NMAX each; the results of Operation C (see OUT) may again be stored in local memory and/or output to processing circuitry (e.g., a DSP) via the interconnect network for further data processing; notably, the configurations and systolic arrays illustrated in FIG. 9 are exemplary and the inventions are not limited to processes and/or algorithms implemented in accordance with such exemplary operations, configurations and/or arrays illustrated in FIG. 9;

FIG. 10 illustrates an exemplary 2-stage 4×4 fully connected layer exemplary configuration mapped directly to a plurality of multiplier-accumulator circuitry, according to certain aspects of the present inventions; notably, in one embodiment, where the present inventions are implemented in neural networks, configuration of the multiplier-accumulator circuitry, including the exemplary configuration illustrated in FIG. 10, may be implemented using an inference language (e.g., executing Caffe or TensorFlow models), as illustrated;

Figure 11D:
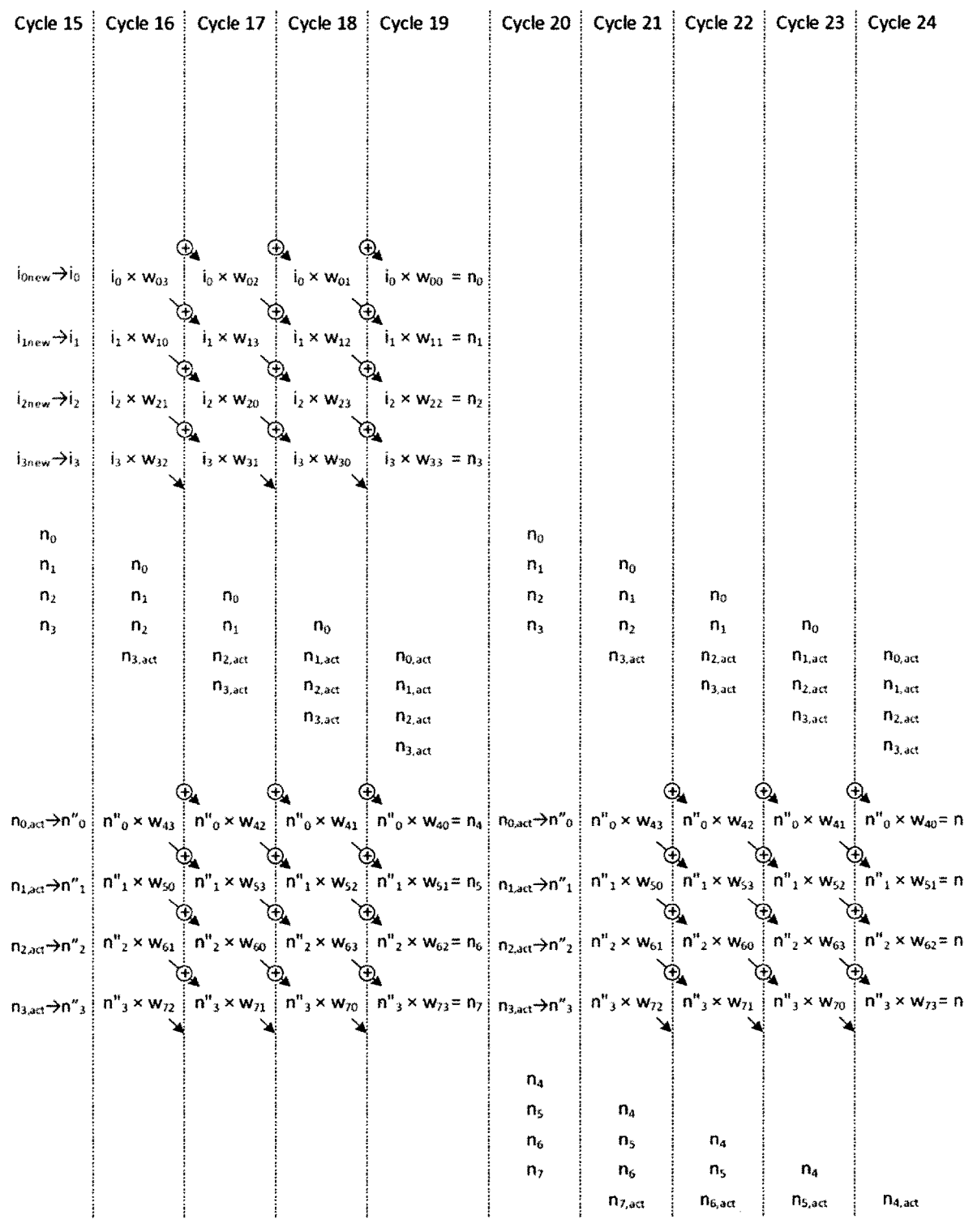

FIG. 11A illustrates an exemplary timing diagram of exemplary multiplication—accumulation operations of multiplier-accumulator circuitry (e.g., the operation of circuitry of FIG. 1A), in accordance with an embodiment of certain aspects of the present inventions; notably, in this embodiment, the multiplier-accumulator circuitry is configured in a pipeline architecture wherein input data is loaded or clocked into the multiplier-accumulator circuitry, while other data is loaded or clocked into or transferred to the registers for use by circuitry implementing or performing the multiply-and-accumulate operations, while other data is stored from the multiplier-accumulator circuitry as output data and unloaded or output (that is, shifted to output MAC_SO of of FIG. 1A); the aforementioned processes continue in a pipelined fashion; certain of the information identified on the exemplary timing diagrams (e.g., number of operations, number of cycles and amount of time) are merely exemplary (e.g., in certain respect, pertinent to the exemplary architecture of the multiplier-accumulator circuitry of FIG. 1A); such information is not intended to be limiting, in any way, to the scope of the present inventions;

FIGS. 11B-11E each illustrate selected portions, as identified in FIG. 11A, of the exemplary timing diagram of exemplary multiplication—accumulation operations of multiplier-accumulator circuitry (e.g., the operation of multiplier-accumulator circuitry of FIG. 1A), in accordance with an embodiment of certain aspects of the present inventions; notably, the shadow registers (e.g., within the multiplier-accumulator circuitry—see FIG. 1A) may be employed to facilitate or implement the pipelined operations; and FIG. 12 illustrates a schematic block diagram of a plurality of interconnected multiplier-accumulator circuitry (for example, each having a plurality (e.g., two) multiplier-accumulator circuits—for example, a first including multiplier 0 and accumulator 0 and a second circuit including multiplier 1 and accumulator 1, like that of FIG. 1A), according to exemplary embodiments of certain aspects of the present inventions, to perform/implement the multiply and accumulate operations in a concatenated manner (see, e.g., FIGS. 2A and 11A); in the illustrated embodiments, the multiplier-accumulator circuitry output/provide a partially completed operation (e.g., at output MAC O—see, e.g., FIG. 1A) to an input (e.g., at input MAC I—see FIG. 1A) of a successive multiplier-accumulator circuitry to process data, in a concatenated manner, wherein the output of a multiplier-accumulator circuitry X is configurable to be input into a preceding multiplier-accumulator circuitry (e.g., multiplier-accumulator circuitry A in this illustrative embodiment); thus, as noted above, the output (e.g. MAC_O) of a subsequent or later multiplier-accumulator circuit (e.g., the final multiplier-accumulator of a series—here, the multiplier-accumulator circuit of multiplier-accumulator circuitry X) is concatenated and applied back into the input of a preceding multiplier-accumulator circuit (e.g., the first of multiplier-accumulator circuit (e.g. MAC_I) of multiplier-accumulator circuitry A); in this embodiment, input selection circuit may be controlled to input multiple-accumulation data from (i) a multiplier-accumulator circuit of multiplier-accumulator circuitry X (i.e., the same ring) or (ii) a multiplier-accumulator circuit of another multiplier-accumulator circuitry (e.g., a multiplier-accumulator circuit in the same ring or another ring) of the configuration.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions relate to multiplier-accumulator circuitry and techniques for operating such circuitry. In one embodiment, the multiplier-accumulator circuitry of the present inventions include a plurality of separate multiplier-accumulator circuits and a plurality of registers (including a plurality of shadow registers) that facilitate pipelining of the multiply and accumulate operations. Moreover, the multiplier-accumulator circuitry further includes circuitry that facilitating implementation or incorporation into a concatenation architecture whereby a plurality of multiplier-accumulator circuitry concatenate the multiply and accumulate operations. In this way, the plurality of multiplier-accumulator circuitry may perform and/or complete such operations more quickly and/or with fewer/less data movement and memory access. Notably, the extent or length of the concatenation (i.e., number of multiplier-accumulator circuits employed and/or interconnected to implement or perform the multiply and accumulate operations) may be modified, changed or adjusted (i.e., increased or decreased), for example, in situ (i.e., during operation of the integrated circuit) to, for example, meet system requirements or constraints (e.g., temporal-based requirements).

In one embodiment, the multiplier-accumulator circuitry also includes load/store registers (two interconnected registers wherein the output of each register is routed to the input of the other register), located at the output of the accumulation circuit to facilitate continual operation of the multiplier-accumulator circuitry while data is shifting in and out of the multiplier-accumulator circuitry. In this way, the multiplier-accumulator circuitry may perform operations on multiple clock edges thereby complete such operations in a continual, pipelined basis. Notably, the load and store operations of the load/store registers may occur in the same clock cycle, in which case the data in the regular register and the data in shadow shift-register are swapped.

In another aspect, the present inventions relate to an integrated circuit having a plurality of multiplier-accumulator circuits and techniques for operating such circuits. For example, in one embodiment, the integrated circuit is a FPGA including a plurality of logic tiles—wherein one or more of such tiles include a plurality of multiplier-accumulator circuits to implement multiply and accumulate operations, for example, in a pipelining manner. Moreover, such multiplier-accumulator circuits may further facilitate concatenating the multiply and accumulate operations thereby allowing a plurality of multiplier-accumulator circuitry to perform such operations more quickly. Indeed, the extent or length of the concatenation (i.e., number of multiplier-accumulator circuits employed and/or interconnected to implement or perform the multiply and accumulate operations) may be modified, changed or adjusted (i.e., increased or decreased), for example, in situ (i.e., during operation of the integrated circuit) to, for example, meet system requirements or constraints (e.g., temporal-based requirements).

With reference to FIG. 1A, in one embodiment, the exemplary multiplier-accumulator circuitry includes two separate multiplier-accumulator circuits—a first multiplier-accumulator circuit including multiplier 0 and accumulator 0 and a second multiplier-accumulator circuit including multiplier 1 and accumulator 1. The multiplier-accumulator circuitry further includes a plurality of shadow registers (including shadow register 0 and shadow register 1) that store the input data until transferred to a second set of registers (i.e., register 0 and register 1, respectively) for use by multiplier 0 and multiplier 1, respectively. The multiplier weights are stored in memory (e.g., ROM) and are selectively provided (in relation to the input data associated therewith) to the multiplier 0 and multiplier 1 to execute or perform the multiplication operation. Notably, in the illustrative embodiments, the multiplier-accumulator circuitry is, at times, labeled "2-NMAX" or "NMAX".

With reference to FIGS. 2A and 2B, in one embodiment, in operation, input data is initially clocked into and stored in the shadow registers (i.e., shadow register 0 and shadow register 1) of the multiplier-accumulator circuitry during the Cycles 0 to Cycle 4. On Cycle 5, the input data is clocked into, stored in or transferred to the registers (i.e., registers 0 and 1, respectively) for use by multiplier 0 and multiplier 1 in performance of the multiplication operation (in connection with the weight data, stored in memory, that is associated with the input data). (See, Cycle 6 in FIG. 2C). Thereafter, the output of each multiplier is provided to the associated accumulator and the weighted input data is accumulated before new input data and a new weight data (associated with such "new" input data) is transferred to the multiplier. (See, the clock edge corresponding to end of Cycle 6-start of Cycle 7). These processes continue in a pipelined fashion.

After operating on the input data and accumulating the weighted data, additional operations (e.g., non-linear operations, activation functions) may be performed on the accumulated weighted data during data unloading, or after the data is unloaded. For example, with reference to FIG. 2D, during Cycles 11, 12, 13 and 14, the accumulated weighted data may be applied to additional operations (i.e., any operation now known or later developed may be implemented/employed—all of which are intended to fall within the scope of the present inventions). The additional operations may be performed while new input data is being loaded (from shadow registers) into the registers connected to and associated with the multiplication circuits of the multiplier-accumulator circuitry, and while output data being unloaded or output. In this embodiment, the data loading/input operations (including the multiplications and accumulation), and unloading/output operations are performed and continue in this pipelined fashion. (See, for example, FIGS. 2B-2E).

Notably, in one embodiment, the architecture of the exemplary multiplier-accumulator circuitry is organized to allow for or perform the multiply and accumulate operations illustrated in FIG. 2A in a concatenated manner. In this regard, the multiplier-accumulator circuitry outputs/provides the partially completed operation (e.g., at output MAC O) illustrated in FIG. 1C to an input (e.g., at input MAC I)

of a second multiplier-accumulator circuitry (see FIG. 1A) which is connected to the first multiplier-accumulator circuitry (see FIG. 3). In addition thereto, or in lieu thereof, the output of the multiplier-accumulator circuitry may also be provided to other circuitry, for example, memory. That is, the data may be output or shifted-out of the multiplier-accumulator circuitry at the MAC SO output and the output data generated by the multiplier-accumulator circuitry may be, in one embodiment, stored in memory.

The data of the multiplication weights may be stored in memory associated with the multiplier-accumulator circuitry using any circuitry and technique now known or later developed—all of which are intended to fall within the scope of the present inventions. For example, in one embodiment, such data may be stored in memory of a plurality of multiplier-accumulator circuitry via the circuitry of FIG. 1B. The circuitry and operation of FIG. 1B will be discussed below in connection with other embodiments.

With reference to FIGS. 1A and 1C, in one embodiment, the multiplier-accumulator circuitry includes load/store registers that facilitate continual operation of the multiplier-accumulator circuitry while the data is shifting in and out. (See, e.g., load/store shadow register A and load/store shadow register B in FIG. 1A). That is, the load/store register allows data transfer between the "white" regular register and the "shaded" (or "hashed") shadow shift-register. Here, when the multiply and accumulate operations is complete, the output data are first stored in the "white" regular registers. MAC_ST control signal then allows data transfer from the white regular registers unto/into the "shaded" shift-registers. Moreover, if the "white" regular registers need to be initialized to a certain value, the "shaded" shift-registers can shift in the initialization data, and use MAC_LD to transfer data from the "shaded" shift-registers unto/into the "white" regular registers. Both MAC_ST and MAC_LD may occur in the same clock cycle, in which case the data in the "white" regular registers and "shaded" (shadow) shift-registers are swapped.

Notably, with continued reference to FIG. 1A, data may be applied/input directly to the load/store shadow register A and load/store shadow register B via input MAC SI wherein data is shifted into the "shaded" or "hashed" shift-registers. Here, a by-pass circuit (including, e.g., a multiplexer) may be employed to by-pass certain of the multiplier-accumulator circuitry (e.g., including the multiplier-accumulator circuit of multiplier 0 and accumulator 0) wherein data on input signal MAC_SI may be stored in the "shaded" shift-register of the load/store register(s) at the output of accumulator 0. Similarly, a by-pass circuit (e.g., a multiplexer) may be employed to by-pass the multiplier-accumulator circuitry of multiplier 1 and accumulator 1 wherein the data from the "shaded" shift-register of the load/store register(s) at the output of accumulator 0 may be stored in the "shaded" shift-register of the load/store register(s) at the output of accumulator 1. In one embodiment, data (e.g., initialization data) may be shifted into the registers, and via application of MAC_LD control signal, such data may be transferred data from the "shaded" (shadow) shift-registers unto/into the "white" regular registers for use by or implementation into the multiplier-accumulator circuitry. In one embodiment, the data stored in the load/store register(s) (i.e., load/store shadow register B in this illustrative embodiment), via the by-pass circuit, may then be output to, for example, successive multiplier-accumulator circuitry where the plurality of multiplier-accumulator circuitry are interconnected in a concatenation architecture or configuration. (See, e.g., FIG. 3). The multiplier-accumulator circuitry may thereafter perform the operations, including the multiplication and accumulation operations, as described herein.

In another aspect, the present inventions are directed to an integrated circuit having a plurality of logic tiles—wherein one or more (or all) of such tiles includes a plurality of multiplier-accumulator circuits (e.g., multiplier-accumulator circuitry illustrated in FIG. 1A-1C—i.e., a plurality of separate multiplier-accumulator circuits and a plurality of registers (including a plurality of shadow registers) that facilitate pipelining of the multiply and accumulate operations), to implement multiply and accumulate operations, for example, in a pipelining manner (i.e., employ pipeline processing techniques). (See, e.g., FIG. 4). In one embodiment, the integrated circuit is or includes an FPGA (as noted above, "FPGA" herein means discrete FPGA or embedded FPGA) coupled to and/or including a plurality of multiplier-accumulator circuitry (labeled as "NMAX Rows"). (See, e.g., FIG. 5A). The multiplier-accumulator circuitry may be organized in rows and/or columns (hereinafter collectively "rows" or "Rows"). That is, in one embodiment, the plurality of multiplier-accumulator circuits are connected in series (in concatenation architecture) and organized into a plurality of rows, each row including a plurality of multiplier-accumulator circuits. As discussed in detail below, the rows of multiplier-accumulator circuits may be connected or disconnected to adjust the extent or length of the concatenation (i.e., increase or decrease the number of multiplier-accumulator circuits interconnected to perform the multiply and accumulate operations).

Notably, the integrated circuit may include "local" memory (e.g., SRAM, DRAM, MRAM, ROM and/or Flash memory) used during operation (e.g., during/for data processing of the FPGA and/or multiplier-accumulator circuitry). (See, e.g., FIGS. 4 and 5A).

In one embodiment, the FPGA portion of the integrated circuit includes a plurality of logic tiles. (See, e.g., FIGS. 6A and 6B). The FPGA may also include control circuitry, timing or clock circuitry, and power supply circuitry. In one embodiment, each logic tile may include a plurality of multiplexers having two or more inputs which are electrically interconnected to form a switch interconnect network (e.g., which may be configured as a hierarchical and/or mesh interconnect network) as well as connected to, for example, associated data storage elements, input pins and/or look-up tables (LUTs) that, when programmed, determine the operation of the multiplexers).

With reference to FIGS. 5B, 5C and 5D, one or more (or all) of the logic tiles may also include one or more computing elements (e.g., a plurality of multiplier-accumulator circuits—such as, for example, a plurality of the multiplier-accumulator circuitry of FIG. 1A interconnected as illustrated in FIG. 3). (See regions labeled "NMAX Cluster" in the logic tile layout or physical floorplan illustrated in FIGS. 5B and 5C). As noted above, an interconnect network (e.g., a mixed-mode interconnect network (i.e., a hierarchical switch matrix interconnect network and a mesh, torus or the like interconnect network (hereinafter collectively "mesh network" or "mesh interconnect network")). For example, with reference to FIG. 5D, in one embodiment, each logic tile may include multiplier-accumulator circuitry, logic-memory and/or DSP cores and contain more than a thousand LUTs (e.g., 6-input LUTs) from hundreds of reconfigurable building blocks (RBBs), including Kb RAM, and hundreds of I/O blocks (e.g., 2-input, 2-output each). As noted above, the logic tiles may be "tiled" to form an array from, for example, the LUTs.

In one embodiment, the switch interconnect network of each logic tile may include a plurality of switch matrices (e.g., an M×N switch matrix) arranged in a plurality of switch matrix stages or switch matrices stages which are interconnected into a hierarchical interconnect network. (See, for example, the interconnect networks described and/or illustrated in U.S. Pat. No. 9,503,092, which are incorporated herein by reference). In one embodiment, the switch interconnect network directly connects to at least one multiplier-accumulator circuit in each row of multiplier-accumulator circuits to, among other things, provide flexibility in configuring, adjusting, modifying and/or changing (i) which multiplier-accumulator circuits (and/or rows of multiplier-accumulator circuits) are employed and/or interconnected to implement or perform the multiply and accumulate operations and/or (ii) the number of multiplier-accumulator circuits that are employed and/or interconnected to perform the multiply and accumulate operations. As noted above, such configuration, selection, modification and/or adjustment may be implemented, for example, in situ (i.e., during operation of the integrated circuit) to, for example, meet or exceed system requirements or constraints.

The switch interconnect networks of the logic tiles may also be interconnected via tile-to-tile interconnects of a tile-to-tile interconnect network (e.g., a mesh interconnect network wherein a plurality of tile-to-tile interconnects provide communications between, for example, the one or more switch matrices of the logic tile interconnect networks of the logic tiles). As such, logic tiles are configurable to communicate (e.g., provide/receive data and address and provide control information), during operation of the integrated circuit, with the computing elements (e.g., a plurality of multiplier-accumulator circuitry) within the logic tile as well as with at least one other logic tile of the FPGA. Moreover, such logic tiles are configurable to interconnect computing elements (e.g., (i) processor circuitry (e.g., one or more one or more digital signal processors (DSPs)) and (ii) the plurality of multiplier-accumulator circuitry) of or within the same logic tile and/or different logic tiles od the FPGA of the integrated circuit.

With reference to FIGS. 5C, 5D and 7A-7C, as mentioned above, one or more (or all) logic tiles of the FPGA of the integrated circuit include a plurality of multiplier-accumulator circuits (labeled "NMAX Rows" or "NMAX Clusters") which are the multiplier-accumulator circuitry (e.g., the multiplier-accumulator circuitry described above and as illustrated in FIGS. 1A-1C). In these exemplary embodiments, a plurality of multiplier-accumulator circuits are connected together as illustrated in FIG. 3 to provide rows of multiplier-accumulator circuitry. The rows of multiplier-accumulator circuitry are disposed between and connected to weight/data memory (e.g., SRAM memory banks—See FIGS. 5B and 5C). In one embodiment, the weight/data memory stores data which is representative of the multiplier weight data employed in the multiplication operation for a plurality of the multiplier-accumulator circuitry. The weight/data memory, in one embodiment, may receive the data which is representative of the multiplier weights via the interconnect network. That is, in one embodiment, control circuitry manages/controls writing of data which is representative of the multiplier weights into the weight/data memory e.g., SRAM memory banks) via the interconnect network. Thereafter, the multiplier weight data may be written into the memory (e.g., ROM) of multiplier-accumulator circuitry which selectively provides the weight data (in relation to the input data associated therewith) to the multiplier 0 and multiplier 1 (as the case may be) to perform the multiplication operation (see FIG. 1A).

With continued reference to FIGS. 5C, 5D and 7A-7C, in another embodiment, the weight/data memory may receive the data which is representative of the input data via the interconnect network. Such data may be read, provided or arrive from, for example, an external memory (e.g., DRAM) or other on-chip memory (i.e., memory disposed or manufactured in/on the integrated circuit (e.g., on-chip SRAM)). Indeed, in another embodiment, the weight/data memory may receive and store data from one or more NMAX clusters (e.g., output data from NMAX circuitry (such as from other NMAX circuitry which is in the associated/same logic tile or a different logic tile of the plurality of logic tiles) or another set of NMAX clusters (such as from another NMAX cluster which is in the associated/same logic tile or a different logic tile of the plurality of logic tiles). In either embodiment, the input data is shifted into the data input (e.g. D0_I, or D1_I port of FIG. 1A) of the NMAX circuitry or NMAX cluster. Such connection may be provided between, for example, NMAX circuitry of the same or different logic tile via the interconnect network of the logic tile.

In yet another embodiment, the weight/data memory may receive the data which is representative of the partially-accumulated MAC data via the interconnect network. Such data may arrive/be provided from, for example, an external memory (e.g., DRAM, another on-chip memory (e.g., on-chip SRAM), or the output of one or more other NMAX circuitry or NMAX clusters (i.e., another set of NMAX clusters). Thereafter, the partially-accumulated MAC data is shifted into the MAC shadow-register input (e.g. MAC_SI port of FIG. 1A) of the NMAX cluster to initialize the MAC processing operations of the NMAX circuitry in those NMAX clusters to the partially-accumulated MAC data to continue the multiply and accumulation processing or operations. Such connection, in one embodiment, is provided/made via the switch interconnect network of the logic tile.

Notably, in one embodiment, where the weight/data memory includes SRAM memory banks, it may be advantageous to employ a modified addressing circuitry and technique to write the data into the SRAM. With reference to FIG. 8, the technique for addressing the SRAM may include (in addition to the address circuitry in the SRAM), the circuitry that facilitates writing to more of the SRAM via the data extension technique and address extension technique. With data extension, the SRAMs are effective wider than each individual SRAM data ports, thereby permitting the data representative of the multiplier weights to write data in parallel into the weight/data SRAM banks (e.g. Q0 and Q8 in FIG. 8 are 32-bit data interfaces, each can write to 2 SRAM at the same time), thereby accelerating the operations of writing the appropriate data into the weight/data SRAM banks. Address extension allows for access of individual SRAM banks without requiring individual addressing for each SRAM bank (e.g. SRAM12, 13, 14, 15 in FIG. 8 share a common output data Q8[31:16], and share a common input data D8[31:16], but they are individually addressable via XA[11] and XA[12]), by having one address applied to the SRAM address extension circuitry, a plurality of SRAM banks behave, function or operate as a single, "deeper" SRAM bank. Indeed, implementing an address extension reduces the input/output pins/conductors employed to interface with the interconnect network (e.g. SRAM8, 9, 10, 11, 12, 13, 14, and 15 in FIG. 8 share one set of inputs and output data port (D8, Q8) and one set of control inputs (WA8, XA8, WE8, CE8, SLP8, SD8)). In addition, a ping-pong buffer permits an odd/even read-write technique/approach to facilitate writing and read data to/from each bank of SRAM at the same time, as long as the read address is odd and the write address is even, or vice versa.

The data of the multiplication weights may be stored in the memory associated with the multiplier-accumulator circuitry using any circuitry and technique now known or later developed—all of which are intended to fall within the scope of the present inventions. As mentioned above, in one embodiment, such data may be stored in memory of a plurality of multiplier-accumulator circuitry employing the circuitry illustrated in FIG. 1B. Briefly, and with reference to FIGS. 1B, 5C and 7C, the weight data may be written into the memory (e.g., ROM) associated with the multiplier-accumulator circuitry directly via the associated interconnect network, which is connected to input WD_I, or via the weight/data memory (e.g., SRAM memory banks) which is connected to inputs WD NI and/or WD SI. The weight data selection multiplexer (MUX) in the multiplier-accumulator circuitry determines which input is selected/enabled (i.e., connected to the output of the multiplexer) and thereby provided to the memory to facilitate writing data into the memory (e.g., ROM) of the multiplier-accumulator circuitry.

Where the memory (e.g., ROM) of each multiplier-accumulator circuitry is written to directly via the input WD I, the interconnect network connects to the input WD I via WD_I of the NLINX interface connector to directly and serially/sequentially write the data to the memory of each multiplier-accumulator circuitry by shifting in the data. In one embodiment, the NLINX interface connector includes a WD_I connection/output for each two rows of 2-NMAX multiplier-accumulator circuitry to connect to the WD I signal line associated with each of multiplier-accumulator circuitry of the two rows of 2-NMAX multiplier-accumulator circuitry. (See, FIGS. 7A-7C).

Where, however, the weight data is written into the rows of multiplier-accumulator circuitry from the weight/data memory (e.g., SRAM memory banks) disposed between and connected to memory in each multiplier-accumulator circuitry via the signals lines WD NI and/or WD IS, the memory writes the data into the memory (e.g., ROM) of each multiplier-accumulator circuitry in each row of multiplier-accumulator circuitry in parallel. The weight data for each row of multiplier-accumulator circuitry may be written serially/sequentially. As such, the time to write the weight data into the rows of multiplier-accumulator circuitry in this embodiment may be considerably faster than the direct and serial/sequential write operation from the associated logic tile interconnect network via WD_I of the NLINX interface connector to the input WD I of each row of multiplier-accumulator circuitry.

As noted above, in one embodiment, logic circuitry (e.g., one or more computing elements such as, e.g., processor circuit (e.g., a data processor or digital signal processor), controller circuit, an accelerator, a data encryption engine, a filter, an encoder, a state machine and/or combinational logic circuit) is located adjacent to the weight/data memory (e.g., SRAM memory banks) and between the weight/data memory and the I/O circuitry. (See, e.g., FIGS. 5C and 7A-7C). The computing elements may be configured to connect to the interconnect network of the logic tile (e.g., a hierarchical interconnect network and/or a mixed-mode interconnect network, U.S. Pat. No. 9,503,092). The interconnect network of the logic tile may connect the computing elements of the logic tile to computing elements or other circuitry in other logic tiles via tile-to-tile interconnects of a tile-to-tile interconnect network (e.g., a mesh interconnect network). Here, the tile interconnect network are connected to interconnect networks of other logic tiles (e.g., adjacent logic tiles of, for example, an array of logic tiles—see, for example, FIGS. 5B, 5C and 6B) via the tile-to-tile interconnect network which provides or facilitate configurable or re-configurable communication/connection to other logic tiles (e.g., circuitry (e.g., one or more computing elements) disposed therein) of the plurality of logic tiles (e.g., which may be arranged in an array of one or more rows and/or columns).

With reference to FIGS. 5B and 5C, in one embodiment, the interconnect network of the logic tile is disposed in the center or spine of the logic tile and the tile-to-tile interconnects are illustrated as double arrow lines disposed on the edges of the logic tile (except for those double arrow lines illustrated in the I/O or I/O circuitry and labeled accordingly).

Notably, I/O circuitry is disposed on the edges to facilitate configurable or re-configurable connection to circuitry external to the logic tile (or array of logic tiles), such as, for example, connection to circuitry of a system-on-chip (SOC) of the integrated circuit, external memory interface circuitry (e.g., DRAM interface) and/or one or more memory blocks that are disposed between logic tiles (see, e.g., U.S. Pat. No. 9,973,194, which is incorporated by reference herein).

With reference to FIGS. 7A-7C, as noted above, in one embodiment, the plurality of multiplier-accumulator circuitry are organized and/or configured into rows of interconnected multiplier-accumulator circuitry. In this embodiment, each row of multiplier-accumulator circuitry (which consists of a plurality of interconnected multiplier-accumulator circuits) is connected to another row of a plurality of multiplier-accumulator circuitry via row interconnects whereby certain outputs of a row of multiplier-accumulator circuitry are connected to and applied as inputs to the second row of a plurality of interconnected multiplier-accumulator circuitry. For example, with additional reference to FIGS. 1A and 3, the MAC O of the last multiplier-accumulator circuitry in a first row of interconnected multiplier-accumulator circuitry is connected to the MAC I of the first multiplier-accumulator circuitry in a second row of interconnected multiplier-accumulator circuitry. The row interconnects further include other outputs/inputs of the interconnected multiplier-accumulator circuitry of, for example, the embodiment illustrated in FIG. 1A. In the detailed illustrated exemplary embodiment of FIG. 7A-7C, the two rows of multiplier-accumulator circuitry (interconnected via row interconnects) consist of 32 blocks of 2-NMAX multiplier-accumulator circuitry (e.g., like that illustrated in FIG. 1A).

In one embodiment, the extent or length of the concatenation (i.e., number of multiplier-accumulator circuits interconnected to implement or perform the multiply and accumulate operations) may be adjusted (i.e., increased or decreased), for example, in situ (i.e., during operation of the integrated circuit). For example, with reference to FIGS. 7A-7C, in one embodiment, more than two rows of multiplier-accumulator circuitry may be interconnected to provide a longer or larger number or string of interconnected multiplier-accumulator circuitry. For example, the second row of multiplier-accumulator circuitry (see 2-NMAX Row B in FIG. 7C) may be further connect to the third row of multiplier-accumulator circuitry (see 2-NMAX Row C in FIG. 7C) via the NLINX multiplexers and conductors of the NLINX interface connector. Moreover, NLINX multiplexers and conductors of the NLINX interface may be configured to interconnect one or more adjacent and/or non-adjacent rows of multiplier-accumulator circuits. For example, an output of a row of multiplier-accumulator circuits (see MAC_O of Row D in FIG. 7C) may be selectively connected to an input of a non-adjacent row of multiplier-accumulator circuits (see MAC_I of Row A in FIG. 7C). As such, the NLINX interface connector, and specifically the NLINX multiplexers in this illustrative embodiment, is configurable to interconnect rows of multiplier-accumulator circuits wherein the NLINX multiplexers controllably connect an output of last multiplier-accumulator circuit of a row of multiplier-accumulator circuits to an input of a first multiplier-accumulator circuit of one or more different row of multiplier-accumulator circuits.

In addition, NLINX multiplexers and conductors of the NLINX interface connector may be configured to connect adjacent rows of multiplier-accumulator circuits wherein an output of a row of multiplier-accumulator circuits (see MAC_O of Row D in FIG. 7C) may be selectively connected to an input of an adjacent row of multiplier-accumulator circuits (see MAC_I of Row C in FIG. 7C) via the NLINX multiplexers disposed therebetween. As such, in one embodiment, the third row of multiplier-accumulator circuitry is connected to a fourth row of multiplier-accumulator circuitry (see 2-NMAX Row D in FIG. 7C), via row interconnects, to implement a yet even longer or larger string of or interconnected multiplier-accumulator circuitry (i.e., increase the number of multiplier-accumulator circuits interconnected to implement or perform the multiply and accumulate operations) and, the output of the fourth row of multiplier-accumulator circuitry (see 2-NMAX Row D in FIG. 7C) may be connected to the input of adjacent or non-adjacent rows of multiplier-accumulator circuits (see 2-NMAX Row A and/or Row C in FIG. 7C) via the NLINX interface (in this illustrative embodiment of FIGS. 7A-7C, the NLINX multiplexers and conductors of the NLINX interface connector).

Thus, in one embodiment, the switch interconnect network connects to at least one multiplier-accumulator circuit in each row of multiplier-accumulator circuits to, among other things, provide flexibility in configuring, adjusting, modifying and/or changing (i) which multiplier-accumulator circuits (and/or rows of multiplier-accumulator circuits) are employed and/or interconnected to implement or perform the multiply and accumulate operations and/or (ii) the number of multiplier-accumulator circuits that are employed and/or interconnected to perform the multiply and accumulate operations. In one embodiment, configuration circuitry configures the interconnects, for example, via multiplexers/switches, of aspects of the switch interconnect network (in this illustrative embodiment, the NLINX interface connector) to employ or implement a particular number and configuration of the multiplier-accumulator circuits (and/or rows of multiplier-accumulator circuits). The configuration, selection, modification and/or adjustment may be implemented, for example, in situ (i.e., during operation of the integrated circuit) to, for example, perform or provide a particular operation and/or meet or exceed system requirements or constraints (e.g., temporal-based requirements or constraints). (See, e.g. FIG. 9).

Notably, any number of interconnected multiplier-accumulator circuits may be interconnected to implement or perform a concatenated multiply and accumulate operations. In the context of the embodiment illustrated in FIG. 7A-7C, any number of rows of multiplier-accumulator circuitry may be connected (i.e., two, three, four, and so on) to implement or perform a concatenated multiply and accumulate operations. In fact, in one embodiment, all of the multiplier-accumulator circuitry in the logic tile (see, e.g. FIGS. 5B-5D and 7A) may be connected together to form a complete "ring" of multiplier-accumulator circuitry via the NLINX interface connector and row interconnects. Again, while the aforementioned discussion focuses, at times, on connecting rows of multiplier-accumulator circuitry, it should be noted that in one embodiment any number of interconnected multiplier-accumulator circuitry may be interconnected to provide a desired configuration of the logic tile (i.e., interconnecting a plurality of multiplier-accumulator circuitry (see, e.g., FIG. 3)—that is, in one embodiment, any number from two multiplier-accumulator circuitry to all of the multiplier-accumulator circuitry in the logic tile may be interconnected to implement or perform concatenated multiply and accumulate operations).

The plurality of multiplier-accumulator circuitry of the logic tiles may be configured and re-configured (e.g., in situ) to perform predetermined multiple-accumulate operations (e.g., operations typically performed by neural networks). In one embodiment, the plurality of multiplier-accumulator circuitry of the plurality of logic tiles may be configured to perform convolution (i.e., a 3D operation (W×H×Din× Dout). For example, with reference to FIG. 9, in one embodiment, the plurality of multiplier-accumulator circuitry of the logic tiles may be organized/configured into systolic arrays to implement the three layers of convolution. Briefly, the processing of Operation A may be implemented via two rows of interconnected multiplier-accumulator circuitry of 256 NMAX, each would require eight rows of 16 2-NMAX rows (see, FIGS. 7A-7C). The result of Operation A (see OUT) is summed and may be stored in local memory and/or output to processing circuitry (e.g., a DSP) via the interconnect network for further data processing. The processing of Operation B may be implemented via 9 rows of interconnected multiplier-accumulator circuitry of 256 NMAX each. The result of Operation B (see OUT) is summed and may also be stored in local memory and/or output to processing circuitry (e.g., a DSP) via the interconnect network for further data processing. The processing of Operation C may be implemented via 4 rows of interconnected multiplier-accumulator circuitry of 256 NMAX each. The results of Operation C (see OUT) may again be stored in local memory and/or output to processing circuitry (e.g., a DSP) via the interconnect network for further data processing.

In one embodiment, the switch interconnect network is employed to, among other things, provide flexibility in configuring, adjusting, modifying and/or changing (i) which multiplier-accumulator circuits (and/or rows of multiplier-accumulator circuits) are employed and/or interconnected to implement or perform the multiply and accumulate operations and/or (ii) the number of multiplier-accumulator circuits that are employed and/or interconnected to perform the multiply and accumulate operations. That configuration, selection, modification and/or adjustment may be implemented, for example, in situ (i.e., during operation of the integrated circuit).

Notably, the operations, configurations and systolic arrays illustrated in FIG. 9 are exemplary. The inventions are not limited to processes and/or algorithms implemented in accordance with such exemplary operations, configurations and/or arrays but are intended to cover, among other things, any operations, configurations and/or arrays now known or later developed.

In the context of neural networks, it may be advantageous to employ program the configuration of the multiplier-accumulator circuitry using an inference language (e.g., Caffe or TF). For example, with reference to FIG. 10, in one embodiment, a 2-stage 4×4 fully connected layer exemplary configuration maps directly to multiplier-accumulator circuitry and architecture of the present inventions. The configurable and reconfigurable logic of the FPGA facilitates implementation of control logic (e.g., load/unload and data path control) employed.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, the stages of the multiplier-accumulator circuitry may be more fully pipelined and/or written to memory. (See, e.g., FIGS. 11A-11E). Here again, shadow registers (e.g., within the multiplier-accumulator circuitry—see FIG. 1A) are employed to facilitate or implement the pipelined operations.

Moreover, the multiplier-accumulator circuitry may be configured and/or re-configured (e.g., at start-up and/or in situ) to implement any functions employing multiply and accumulate operations now known or later developed. For example, in one embodiment, the output of a multiplier-accumulator circuit of the circuitry may be connected to an input of earlier multiplier-accumulator circuit in the series of circuitry. For example, with reference to FIG. 12, a plurality of interconnected multiplier-accumulator circuitry (for example, each having a plurality (e.g., two) multiplier-accumulator circuits—for example, a first including multiplier 0 and accumulator 0 and a second circuit including multiplier 1 and accumulator 1, like that of FIG. 1A), may be connected in series to perform/implement the multiply and accumulate operations in a concatenated manner (see, e.g., FIGS. 2A and 11A). Here, the multiplier-accumulator circuitry output/provide a partially completed operation (e.g., at output MAC O—see, e.g., FIG. 1A) to an input of a successive multiplier-accumulator circuitry (e.g., at input MAC I—see, FIG. 1A) to process data, in a concatenated manner, wherein the output of a multiplier-accumulator circuitry X is configurable to be applied or input into a preceding multiplier-accumulator circuitry A (in FIG. 12, the multiplier-accumulator circuit (e.g. MAC_I) of multiplier-accumulator circuitry A (via control of the input selection circuit). Thus, the output of a subsequent or later multiplier-accumulator circuit (e.g., the final multiplier-accumulator of a series—here, the multiplier-accumulator circuit of multiplier-accumulator circuitry X) is concatenated back to the input of a preceding multiplier-accumulator circuit (e.g., the first (e.g. MAC_I) of multiplier-accumulator circuit of multiplier-accumulator circuitry A) to implement a multiplier-accumulator circuitry configuration.

With continued reference to FIG. 12, the multiplier-accumulator circuitry may be configured and/or re-configured such that the multiplier-accumulator circuitry may receive multiple-accumulation data, via control of the input selection circuit (e.g., multiplexer), from (i) a multiplier-accumulator circuit of multiplier-accumulator circuitry X (i.e., the same ring) or (ii) a multiplier-accumulator circuit of another multiplier-accumulator circuitry (e.g., a multiplier-accumulator circuit in the same ring or another ring) of the configuration. All combinations and permutations are intended to fall within the scope of the present inventions.

Notably, the configuration, selection, modification and/or adjustment of the series of a plurality of multiplier-accumulator circuitry may be implemented, for example, in situ (i.e., during operation of the integrated circuit) to, for example, perform or provide a particular operation and/or meet or exceed system requirements or constraints (e.g., temporal-based requirements or constraints). (See, e.g. FIG. 9).

Importantly, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Further, although the memory cells in certain embodiments are illustrated as static memory cells or storage elements, the present inventions may employ dynamic or static memory cells or storage elements. Indeed, as stated above, such memory cells may be latches, flip/flops or any other static/dynamic memory cell or memory cell circuit or storage element now known or later developed.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

In the claims, and elsewhere, the terms "comprises," "comprising," "includes," "including," "have," and "having" or any other variation thereof, are intended to cover a non-exclusive inclusion, such that a process, method, circuit, article, integrated circuit or apparatus that includes/comprises a list of elements, components, steps (etc.) does not include only those elements, components, steps (etc.) but may include other elements, components, steps (etc.) not expressly listed or inherent to such process, method, circuit, article, integrated circuit or apparatus. Further, in the claims, and elsewhere, use of the terms "connect", "connected", "connecting" or "connection" should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

In the claims, and elsewhere, the terms "a" and "an" herein do not denote a limitation of quantity, but rather denote the presence of at least one of the referenced item.

Further, the terms "first," "second," and the like, herein do not denote any order, quantity, or importance, but rather are used to distinguish one element from another.

Moreover, in the claims, and elsewhere, the term "logic tile" means a design unit or block of a plurality of transistors (typically more than thousands), which, in this application, is capable of connecting to a plurality of other (e.g., neighboring or adjacent) logic tiles, logic cells, logic cores, configurable logic blocks, logic array blocks and/or logic blocks.

In addition, in the claims, and elsewhere, the term "integrated circuit" means, among other things, a processor, controller, state machine, gate array, SoC, PGA and/or FPGA. The term "integrated circuit" also means, for example, a processor, controller, state machine and SoC—including an embedded FPGA. For the avoidance of doubt, field programmable gate array or FPGA means both an FPGA and an embedded FPGA.

Further, the term "multiplexers", in the claims, means multiplexers and/or switches. The term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. In addition, the term "data" means, among other things, information (plural or singular), for example, provided or contained in a current or voltage signal(s) and/or stored in memory or the like), whether in an analog or a digital form, which may be a single bit (or the like) or multiple bits (or the like).

In the claims, the term "MAC circuit" means a multiplier-accumulator circuit, for example, like that described and illustrated in the exemplary embodiment of FIGS. 1A-1C, and the text associated therewith. Notably, however, the term "MAC circuit" is not limited to the particular circuit, logical, block, functional and/or physical diagrams, block/data width, data path width, bandwidths, and processes illustrated and/or described in accordance with, for example, the exemplary embodiment of FIGS. 1A-1C.

In the claims, "row" means, row, column, and/or row and column. For example, in the claims, a "row of MAC circuits" means (i) a row of MAC circuits, (ii) a column row of MAC circuits and/or (iii) a row of MAC circuits and a column of MAC circuits—all of which are intended to fall within the meaning of row of MAC circuits in connection with the scope of the claim.

What is claimed is:

1. An integrated circuit comprising:
   memory to store a plurality of multiplier weight data including first multiplier weight data and second multiplier weight data;
   a plurality of multiplier-accumulator circuits, connected in series, to perform a plurality of multiply and accumulate operations, wherein each multiplier-accumulator circuit includes a multiplier and an accumulator and wherein the plurality of multiplier-accumulator circuits includes:
      a first MAC circuit, coupled to the memory to receive the first multiplier weight data, including:
         a multiplier, coupled to the memory, to multiply first data and the first multiplier weight data and output first product data, and an accumulator, coupled to the multiplier of the first MAC circuit, to add second data and the first product data and output first sum data; and
a second MAC circuit, coupled to (i) the first MAC circuit and (ii) the memory to receive the second multiplier weight data, including:
a multiplier, coupled to the memory, to multiply third data and the second multiplier weight data and output second product data, and
an accumulator, coupled to the multiplier of the second MAC circuit and the accumulator of the first MAC circuit, to generate and output second sum data; and
a first load-store register, coupled to: (i) an output of the accumulator of the first MAC circuit and (ii) an input of the accumulator of the second MAC circuit.

2. The integrated circuit of claim 1 wherein:
the first load-store register is configurable to temporarily store initialization data and to load the initialization data into the accumulator of the second MAC circuit, and
the accumulator of the second MAC circuit, in a first mode of operation, generates the second sum data using the initialization data and the second product data, output from the multiplier of the second MAC circuit.

3. The integrated circuit of claim 2 wherein:
the accumulator of the second MAC circuit, in a second mode of operation, generates the second sum data using the first sum data, output from the accumulator of the first MAC circuit, and the second product data, output from the multiplier of the second MAC circuit.

4. The integrated circuit of claim 2 wherein:
the first load-store register includes two interconnected registers.

5. The integrated circuit of claim 2 further including:
a second load-store register, coupled to an output of the accumulator of the second MAC circuit.

6. The integrated circuit of claim 2 wherein:
the plurality of multiplier-accumulator circuits further includes a third MAC circuit, coupled to: (i) the second MAC circuit and (ii) the memory to receive third multiplier weight data, wherein the third MAC circuit includes:
a multiplier to multiply fourth data and the third multiplier weight data and output a third product data, and
an accumulator, coupled to the multiplier of the third MAC circuit and the accumulator of the second MAC circuit, to generate and output third sum data, wherein the integrated circuit further includes:
a second load-store register, coupled between an output of the accumulator of the second MAC circuit and an input of the accumulator of the third MAC circuit, and configurable to temporarily store second initialization data and to load the second initialization data into the accumulator of the third MAC circuit, and
wherein the accumulator of the third MAC circuit, in a first mode of operation, generates the third sum data using the second initialization data, loaded from the second load-store register, and the third product data, output from the multiplier of the third MAC circuit.

7. The integrated circuit of claim 6 wherein:
the accumulator of the third MAC circuit, in a second mode of operation, generates the third sum data using the second sum data, output from the accumulator of the second MAC circuit, and the third product data, output from the multiplier of the third MAC circuit.

8. The integrated circuit of claim 2 further including:
a second load-store register, coupled to an output of the accumulator of the second MAC circuit, and
a by-pass circuit, coupled between the first load-store register and the second load-store register.

9. The integrated circuit of claim 8 wherein:
the by-pass circuit includes a multiplexer.

10. An integrated circuit comprising:
memory to store a plurality of multiplier weight data including first and second multiplier data;
a plurality of multiplier-accumulator circuitry, serially connected into a processing pipeline to perform a plurality of multiply and accumulate operations, wherein each multiplier-accumulator circuitry includes:
a first MAC circuit, coupled to the memory to receive the first multiplier weight data, including:
a multiplier, coupled to the memory, to multiply first data and the first multiplier weight data and output first product data, and
an accumulator, coupled to the multiplier of the first MAC circuit, to add second data and the first product data and output first sum data; and
a second MAC circuit, coupled to (i) the first MAC circuit and (ii) the memory to receive the second multiplier weight data, including:
a multiplier, coupled to the memory, to multiply third data and the second multiplier weight data and output second product data, and
an accumulator, coupled to the multiplier of the second MAC circuit and the accumulator of the first MAC circuit, to generate and output second sum data; and
a first load-store register, coupled to: (i) an output of the accumulator of the first MAC circuit and (ii) an input of the accumulator of the second MAC circuit.

11. The integrated circuit of claim 10 further including:
a second load-store register, coupled to: (i) an output of the accumulator of the second MAC circuit and (ii) an input of the accumulator of the first MAC circuit of the successive multiplier-accumulator circuitry of the plurality of serially connected multiplier-accumulator circuitry.

12. The integrated circuit of claim 11 wherein:
the first load-store register is configurable to temporarily store initialization data and to load the initialization data into the accumulator of the second MAC circuit.

13. The integrated circuit of claim 11 wherein:
each multiplier-accumulator circuitry further includes:
a by-pass circuit, coupled between the first load-store register and the second load-store register of the associated multiplier-accumulator circuitry.

14. The integrated circuit of claim 13 wherein:
the by-pass circuit includes a multiplexer.

15. The integrated circuit of claim 11 wherein:
each of the first load-store register and the second load-store register of each multiplier-accumulator cicuitry includes two interconnected registers.

16. An integrated circuit comprising:
memory to store a plurality of multiplier weight data;
a plurality of MAC circuits, serially connected into a processing pipeline having at least three stages, to perform a plurality of multiply and accumulate operations, wherein each MAC circuit includes:

a multiplier, coupled to an output of the associated register and the memory, to multiply first data and a first multiplier weight data and output a first product data, and an accumulator, coupled to the multiplier of the associated MAC circuit, to add first input data and the first product data, output from the multiplier of the associated MAC circuit, to output first sum data; and a plurality of load-store registers, wherein each load-store register is associated with one of the MAC circuits, wherein each load-store register includes an input to receive initialization data and an output that is coupled to an associated input of the accumulator of the associated MAC circuit.

17. The integrated circuit of claim 16 wherein each MAC circuit further includes:

a first shadow register, coupled between a first input of the associated MAC circuit and the multiplier of the associated MAC circuit, wherein the first shadow register includes (i) an input coupled to a first input of the associated MAC circuit and (ii) an output coupled to an input of the multiplier of the associated MAC circuit.

18. The integrated circuit of claim 16 wherein:

each load-store register of the plurality of load-store registers includes two interconnected registers.

19. The integrated circuit of claim 18 wherein:

each load-store register includes an input to receive first sum data output from accumulator of the associated MAC circuit and, in a first mode of operation, temporarily store the first sum data.

20. The integrated circuit of claim 16 further including:

a plurality of by-pass circuits, wherein each by-pass circuit of the plurality of by-pass circuits is coupled between successive load-store registers.

21. The integrated circuit of claim 20 wherein:

the by-pass circuit includes a multiplexer.

* * * * *